US012629726B2

(12) United States Patent
Eom et al.

(10) Patent No.: US 12,629,726 B2
(45) Date of Patent: May 19, 2026

(54) APPARATUS FOR TREATING SUBSTRATE AND METHOD FOR TREATING A SUBSTRATE

(71) Applicant: SEMES CO., LTD., Cheonan-si (KR)

(72) Inventors: Sung Hun Eom, Hwaseong-si (KR); Tae Won Yun, Namwon-si (KR); Ha Neul Yoo, Anyang-si (KR); Ji Hyeong Yu, Uijeongbu-si (KR)

(73) Assignee: SEMES CO., LTD., Cheonan-si (KR)

( * ) Notice: Subject to any disclaimer, the term of this patent is extended or adjusted under 35 U.S.C. 154(b) by 474 days.

(21) Appl. No.: 18/182,498

(22) Filed: Mar. 13, 2023

(65) Prior Publication Data

US 2024/0100572 A1     Mar. 28, 2024

(30) Foreign Application Priority Data

Sep. 27, 2022     (KR) ........................ 10-2022-0122354

(51) Int. Cl.
| | |
|---|---|
| *B08B 1/02* | (2006.01) |
| *B08B 1/12* | (2024.01) |
| *B08B 1/20* | (2024.01) |
| *B08B 3/02* | (2006.01) |
| *B08B 3/08* | (2006.01) |
| *H01J 37/32* | (2006.01) |

(52) U.S. Cl.
CPC ............... *B08B 3/022* (2013.01); *B08B 1/12* (2024.01); *B08B 1/20* (2024.01); *B08B 3/08* (2013.01); *B08B 2203/005* (2013.01); *H01J 37/32357* (2013.01); *H01J 2237/20214* (2013.01); *H01J 2237/20221* (2013.01); *H01J 2237/335* (2013.01)

(58) Field of Classification Search
CPC .... B08B 1/02; B08B 3/08; B08B 3/02; B08B 1/20
See application file for complete search history.

(56) References Cited

U.S. PATENT DOCUMENTS

| | | | | |
|---|---|---|---|---|
| 6,182,323 | B1 * | 2/2001 | Bahten ...................... | B08B 3/08 |
| | | | | 15/244.4 |
| 10,857,570 | B2 * | 12/2020 | Nishiyama ........ | H01L 21/67046 |
| 12,145,176 | B1 * | 11/2024 | Costo ........................ | B08B 1/20 |

(Continued)

FOREIGN PATENT DOCUMENTS

| | | |
|---|---|---|
| JP | S63155622 | 6/1998 |
| JP | 2020-118698 A | 8/2020 |

(Continued)

OTHER PUBLICATIONS

Office Action for Korean Application No. 10-2022-0122354 dated Feb. 28, 2024.

*Primary Examiner* — Michael D Jennings
(74) *Attorney, Agent, or Firm* — Harness, Dickey & Pierce, P.L.C

(57)     ABSTRACT

The inventive concept provides a substrate treating apparatus. The substrate treating apparatus includes a support unit configured to support a substrate; and a cleaning unit configured to clean a bottom surface of the substrate supported on the support unit, and wherein the cleaning unit comprises: a body; and a protrusion formed to be upwardly protruding from the body, and the protrusion is positioned to be spaced apart from the bottom surface.

17 Claims, 18 Drawing Sheets

(56)                    References Cited

U.S. PATENT DOCUMENTS

| | | | | |
|---|---|---|---|---|
| 2015/0017878 A1* | 1/2015 | Luechinger | ............. | H10F 71/00 |
| | | | | 451/64 |
| 2015/0017889 A1* | 1/2015 | Umemoto | .............. | B24B 37/34 |
| | | | | 451/73 |
| 2016/0056060 A1* | 2/2016 | Doi | ................... | H01L 21/02096 |
| | | | | 15/160 |
| 2021/0362198 A1* | 11/2021 | Lee | ........................... | B08B 3/04 |
| 2022/0037149 A1* | 2/2022 | Nagashima | ....... | H01L 21/32134 |
| 2023/0398580 A1* | 12/2023 | Son | .................... | A46B 15/0038 |

FOREIGN PATENT DOCUMENTS

| | | | |
|---|---|---|---|
| KR | 10-2008-0057496 A | 6/2008 |
| KR | 10-2009-0098711 A | 9/2009 |
| KR | 101048828 B1 | 7/2011 |
| KR | 101061912 B1 | 9/2011 |

* cited by examiner

FIG. 3 second region cleaning step —S10

↓ first region cleaning step —S20

APPARATUS FOR TREATING SUBSTRATE AND METHOD FOR TREATING A SUBSTRATE

CROSS-REFERENCE TO RELATED APPLICATIONS

A claim for priority under 35 U.S.C. § 119 is made to Korean Patent Application No. 10-2022-0122354 filed on Sep. 27, 2022, in the Korean Intellectual Property Office, the entire contents of which are hereby incorporated by reference.

BACKGROUND

Embodiments of the inventive concept described herein relate to a substrate treating apparatus and method, more specifically, a substrate treating apparatus and method for cleaning a substrate.

Various processes such as a photolithography process, an etching process, an ashing process, a thin film deposition process, and a cleaning process are performed to manufacture a semiconductor element or a flat plate display panel. Among these processes, the photolithography process involves sequentially or selectively performing a coating process of supplying a photoresist liquid to a semiconductor substrate to form a coating film on a substrate surface and an exposing process of exposing a coating layer using a mask, and then a developing process of obtaining a desired pattern on the semiconductor substrate by supplying a developing liquid.

In an exposing apparatus for performing an exposing process, if a substrate is mounted on a support plate, if particles are present on a bottom surface of the substrate, this causes a deformation of the substrate in a relevant region, and a local distortion occurs during the exposing process. Accordingly, after performing the coating process, before performing the exposing process, a cleaning process of cleaning the bottom surface of the substrate may be performed. In a general cleaning process, a brush contacts the bottom surface of the substrate to remove particles existing on the bottom surface of the substrate, but in this case, the brush may physically damage the bottom surface of the substrate while contacting with the bottom surface of the substrate. If a damage occurs on the bottom surface of the substrate, a deformation of the substrate occurs in a relevant region, and a distortion occurs during the exposing process because the substrate cannot be accurately mounted on the exposing apparatus.

SUMMARY

Embodiments of the inventive concept provide a substrate treating apparatus and method for efficiently cleaning a substrate.

Embodiments of the inventive concept provide a substrate treating apparatus and method for uniformly cleaning an entire bottom surface of a substrate, while minimizing a damage to the bottom surface of the substrate.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a support unit configured to support a substrate; and a cleaning unit configured to clean a bottom surface of the substrate supported on the support unit, and wherein the cleaning unit comprises: a body; and a protrusion formed to be upwardly protruding from the body, and the protrusion is positioned to be spaced apart from the bottom surface.

In an embodiment, the cleaning unit further includes a cleaning liquid supply unit connected to a hole formed at the body, and supplying a cleaning liquid to the bottom surface.

In an embodiment, the hole and the protrusion are positioned to not overlap each other when seen from above.

In an embodiment, the protrusion has a pad shape.

In an embodiment, the protrusion has a protrusion shape.

In an embodiment, the cleaning unit further includes a sidewall formed along a circumferential direction of the body, and the protrusion is positioned within a region surrounding the sidewall, and a top surface of the sidewall is positioned spaced apart from the bottom surface.

In an embodiment, the substrate treating apparatus further includes a housing at which the support unit and the cleaning unit is positioned therein, and wherein the support unit includes: a first support unit configured to expose an edge region of the substrate, and to support and rotate a central region of the substrate; and a second support unit configured to expose the central region of the substrate, and to support and rotate the edge region, and the second support unit is movable along a guide rail installed at a sidewall of the housing.

In an embodiment, the second support unit includes: a bracket positioned on the guide rail; a plate coupled to the bracket; and a rotation pin installed on the plate, supporting a side end of the substrate, and rotating the substrate with a lengthwise direction of an up/down direction as an axis.

In an embodiment, the first support unit rotates the substrate at a position which overlaps the edge region and the protrusion, and the second support unit rotates the substrate at a position overlapping the central region and the protrusion.

In an embodiment, the cleaning unit further includes a rotation driver for rotating the body with respect to an axis in the up/down direction and penetrating the body, and the first support unit or the second support unit rotates the substrate, and the rotation driver rotates the body, at a position at which the protrusion and the bottom surface of the substrate overlap.

In an embodiment, the cleaning unit includes any one of a deionized water, an ozone water, a hydrogen water, or an ammonia water.

In an embodiment, the cleaning liquid includes a functional water, and the functional water includes a radical.

In an embodiment, a pattern is formed at a top surface of the substrate supported on the support unit.

The inventive concept provides a substrate treating apparatus. The substrate treating apparatus includes a housing; a first support unit configured to support and rotate a central region among the central region and an edge central region of a substrate; a second support unit configured to support and rotate the edge region among the central region and the edge region; a treating container for surrounding a substrate supported on the first support unit or a substrate supported on the second support unit within the housing; and a cleaning unit configured to clean a bottom surface of the substrate, and wherein the first support unit includes a chuck for supporting the central region, and the second support unit includes: a bracket for moving along a guide rail installed at a sidewall of the housing; a plate coupled to the bracket; and a rotation pin installed on the plate and supporting a side end of the substrate, and rotating the substrate with a lengthwise direction of the up/down direction as an axis, and wherein the cleaning unit includes: a body; a sidewall upwardly extending along a circumferential direction of the body; an arm supporting the body; a brush positioned at an inner side of an inner wall and upwardly protruding from the body; and a cleaning liquid supply unit connected to a hole formed at the body and supplying the cleaning liquid to the bottom surface, and wherein a top end of the brush and a bottom end of the sidewall are each positioned to be spaced apart from the bottom surface.

The inventive concept provides a substrate treating method using the apparatus of claim 1. The substrate treating method includes cleaning a second region by exposing the second region of the substrate in a state at which a first region of the substrate is supported; and cleaning the first region by exposing the first region in a state at which the second region is supported, and wherein the cleaning the first region and the cleaning the second region are each performed in a state of the protrusion and the bottom surface being spaced apart from each other.

In an embodiment, the cleaning the second region mounts the substrate on the first support unit supporting the first region and the first support unit rotates the substrate, so the second region and the protrusion overlap when seen from above.

In an embodiment, the cleaning the first region is mounting the substrate on the second support unit for supporting the second region, and the second support unit moves the substrate so the first region and the protrusion overlap when seen from above and rotates the substrate if the first region and the protrusion overlap.

In an embodiment, the cleaning the first region and the cleaning the second region is supplying a cleaning liquid to the bottom surface through a hole formed at the body.

In an embodiment, the cleaning liquid includes any one of a deionized water, an ozone water, a hydrogen water, an ammonia water, or a functional water, and the functional water includes a hydrogen radical.

In an embodiment, a distance between the bottom surface and a top surface of the protrusion is about 2 mm to about 3 mm, if the bottom surface and the protrusion overlap.

According to an embodiment of the inventive concept, a substrate may be efficiently cleaned.

According to an embodiment of the inventive concept, a damage of a bottom surface of a substrate may be minimized while the bottom surface of the substrate is cleaned.

According to an embodiment of the inventive concept, an entire region of a bottom surface of a substrate may be uniformly cleaned.

According to an embodiment of the inventive concept, a re-attaching of impurities attached to a bottom surface of the substrate to the bottom surface of the substrate may be minimized.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 3 is a plan view schematically showing the substrate treating apparatus of FIG.

DETAILED DESCRIPTION

Figure 1:
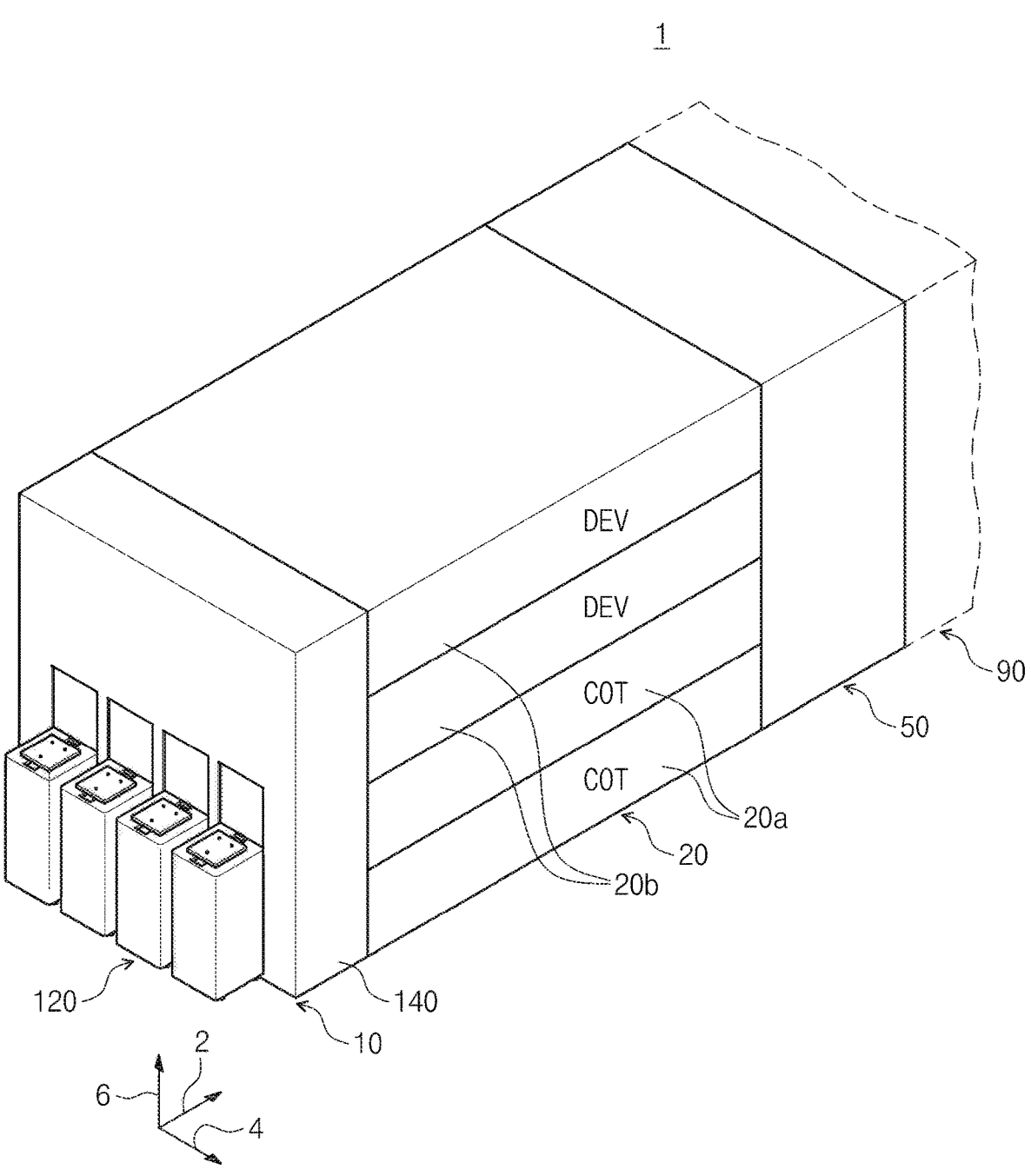
FIG. 1 is a perspective view schematically illustrating a substrate treating apparatus according to an embodiment.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, embodiments of the inventive concept will be described in detail with reference to the accompanying drawings.

The substrate according to an embodiment described below will be described with a circular substrate such as a semiconductor wafer as an example. However, the inventive concept is not limited thereto, and the substrate described in an embodiment of the inventive concept may be a rectangular substrate such as a mask or a display panel.

In an embodiment of the inventive concept, a substrate treating apparatus on which at least one of a coating process for forming a coating film on a surface of a substrate by supplying a photosensitive liquid such as a photoresist liquid on the substrate, an exposure process for exposing with respect to the coating film, and a developing process for forming a desired pattern on the substrate may supplying a developing liquid on the substrate, is described as an example. However, the inventive concept is not limited to the above-described example, and the substrate treating apparatus according to an embodiment may be applied to various devices performing a substrate treating process.

Figure 2:
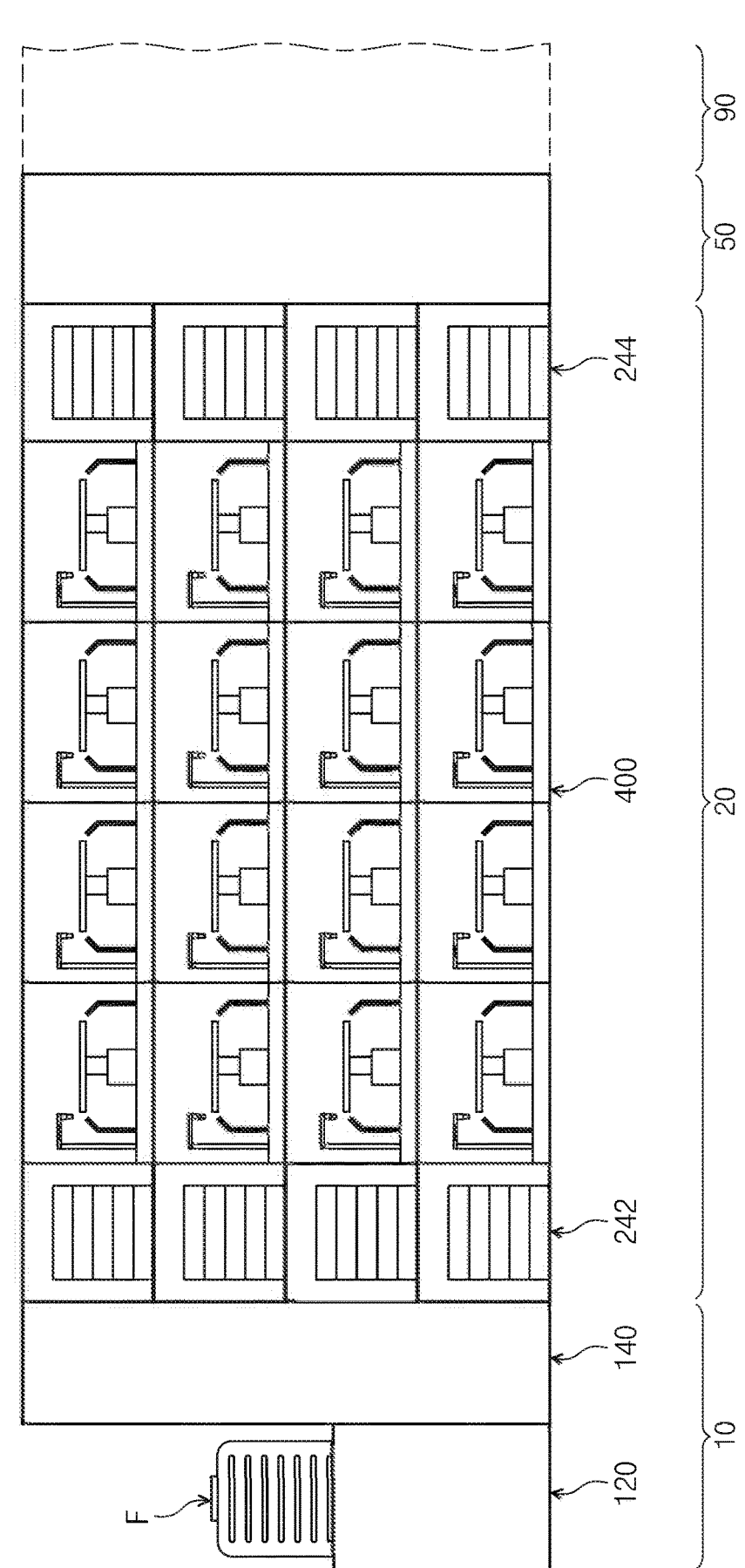
FIG. 2 is a cross-sectional view schematically showing the coating block or developing block of FIG. 1.
Figure 3:
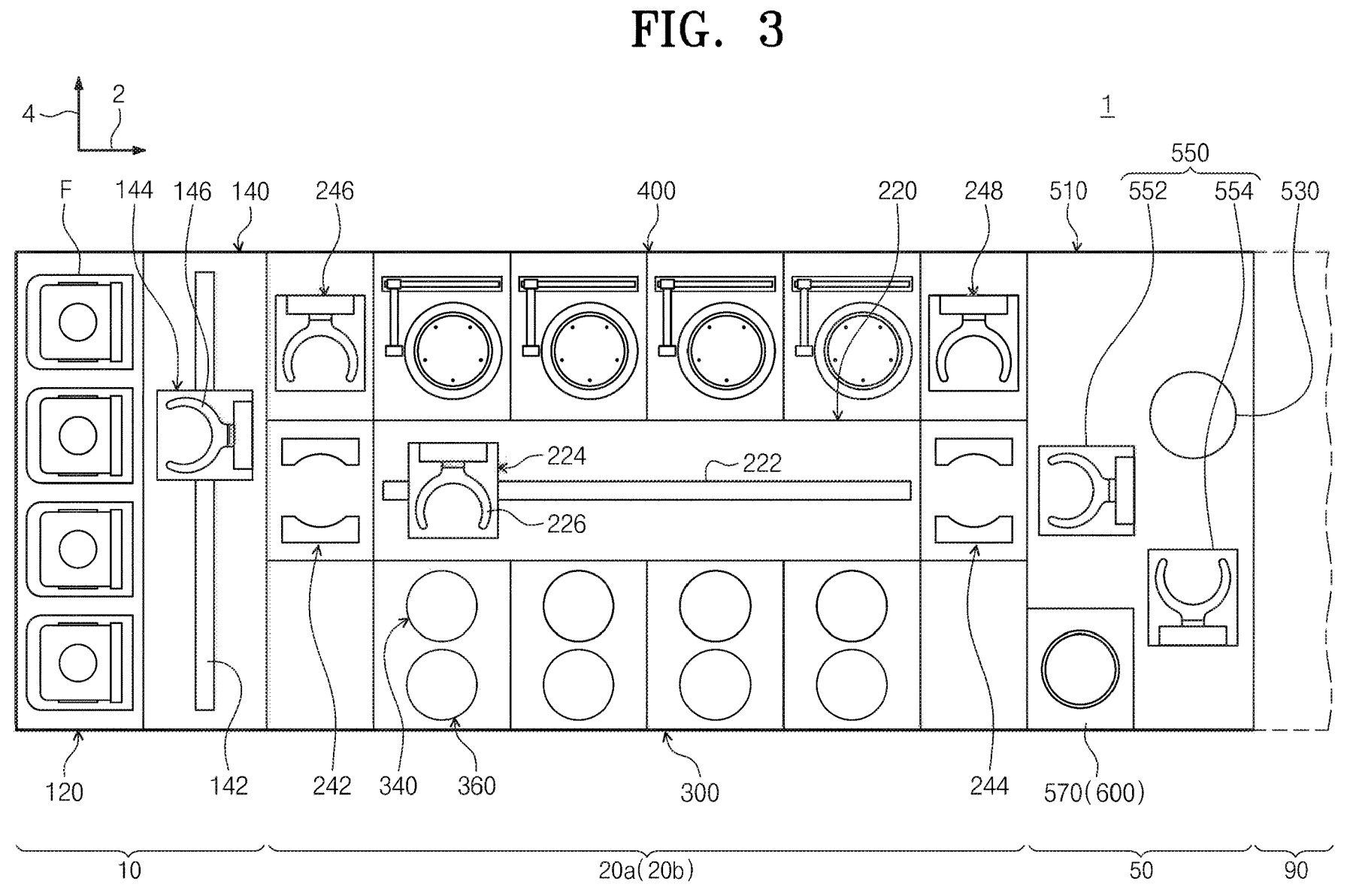

FIG. 1 is a perspective view schematically illustrating a substrate treating apparatus according to an embodiment. FIG. 2 is a cross-sectional view schematically showing the coating block or developing block of FIG. 1. FIG. 3 is a plan view schematically showing the substrate treating apparatus of FIG. 1.

Referring to FIG. 1 to FIG. 3, the substrate treating apparatus 1 may include an index module 10, a treating module 20, and an interface module 50.

The index module 10, the treating module 20, and the interface module 50 are in a direction and sequentially positioned. Hereinafter, a direction in which the index module 10, the treating module 20, and the interface module 50 are disposed is defined as a first direction 2. Also, when viewed from above, a direction perpendicular to the first direction 2 is defined as a second direction 4, and a direction perpendicular to a plane including both the first direction 2 and the second direction 4 is defined as a third direction 6. According to an embodiment, the third direction 6 may be a direction perpendicular to the ground.

The index module 10 transfers the substrate between the container F and the treating module 20. More specifically, the index module 10 takes out the substrate from the container F and transfers the substrate which is taken out to the treating module 20 for treating the substrate. In addition, the index module 10 taken out the substrate on which a predetermined treatment has been completed from the treating module 20 and transfers the substrate to the container F. The index module 10 has a load port 120 and an index frame 140.

A container F in which the substrate is stored is accommodated in the load port 120. The load port 120 is disposed on an opposite side of the treating module 20 based on an index frame 140 to be described later. A plurality of load ports 120 may be provided, and the plurality of load ports 120 are positioned in a line along the second direction 4. The number of load ports 120 may increase or decrease according to a process efficiency or footprint conditions of the treating module 20.

The substrate is stored in the container F. As the container F stored in the load port 120 according to an embodiment, a sealing container such as a front opening unified pod (FOUP) may be used. The container F may be stored in the load port 120 by a means of transfer such as an overhead transfer, an overhead conveyor, or an automatic guided vehicle or by an operator.

The index frame 140 its lengthwise direction horizontal to the second direction 4. An index rail 142 and an index robot 144 are disposed inside the index frame 140. The index rail 142 its lengthwise direction parallel to the lengthwise direction of the index frame 140. The index robot 144 transfers the substrate. More specifically, the index robot 144 may transfer the substrate between the container F stored in the load port 120 and a front buffer 242 to be described later. The index robot 144 moves on the index rail 142 along the lengthwise direction of the index rail 142.

The index robot 144 has an index hand 146. The substrate is placed on the index hand 146. The index hand 146 forwardly and backwardly moves, rotates about the third direction 6, and moves up and down along the third direction 6.

The treating module 20 may receive the substrate stored in the container F and perform a coating process and/or a developing process on the substrate. According to an embodiment, the treating module 20 may include a coating block 20a and a developing block 20b. The coating block 20a performs the coating process on the substrate. The developing block 20b performs a developing process on the substrate.

A plurality of coating blocks 20a may be provided, and the plurality of coating blocks 20a may be disposed to be stacked on each other. In addition, a plurality of developing blocks 20b may be provided, and the plurality of developing blocks 20b may be disposed to be stacked on each other. According to an embodiment, the coating blocks 20a may be disposed below the developing blocks 20b. In addition, each of the coating blocks 20a has the same or similar structure, and may perform the same or similar process. In addition, each of the developing blocks 20b has the same or similar structure, and may perform the same or similar process. However, the inventive concept is not limited thereto, and each coating block 20a may perform different processes, and each developing block 20b may perform different processes. In addition, the number and arrangement of the coating blocks 20a and the number and arrangement of the developing blocks 20b may be variously changed.

Since the coating block 20a and the developing block 20b according to an embodiment are generally configured to have the same or similar structure and arrangement, a description of the developing block 20b will be omitted hereinafter, and the coating block 20a will be mainly described.

The coating block 20a has a transfer chamber 220, buffer chambers 242 and 244, a heat treating chamber 300, and a liquid treating chamber 400.

The transfer chamber 220 has its lengthwise direction parallel to the first direction 2. A guide rail 222 having its lengthwise direction parallel to the first direction 2 and a transfer robot 224 are disposed in the transfer chamber 220. The transfer robot 224 transfers the substrate between the buffer chambers 242 and 244, the heat treating chamber 300, and the liquid treating chamber 400. The transfer robot 224 forwardly and backwardly moves along the lengthwise direction of the guide rail 222 on the guide rail 222. The transfer robot 224 has a transfer hand 226 on which the substrate is placed. Since the structure of the transfer hand 226 has the same or similar structure as that of the index hand 146 described above, a redundant description thereof will be omitted.

The buffer chambers 242 and 244 provide a space at which the substrate taken into the coating block 20a and a substrate taken out from the coating block 20a temporarily remain. A plurality of buffer chambers 242 and 244 may be provided. Some of the buffer chambers are disposed between the index frame 140 and the transfer chamber 220. Hereinafter, these buffer chambers are defined as front buffers 242. In addition, another portion of the buffer chambers are disposed between the transfer chamber 220 and the interface module 50 to be described later. Hereinafter, these buffer chambers are defined as rear buffers 244. A plurality of front buffers 242 may be provided, and the plurality of front buffers 242 may be stacked in a vertical direction. In addition, the plurality of rear buffers 244 may be provided, and the plurality of rear buffers 244 may be stacked in a vertical direction.

Each of the front buffer 242 and the rear buffer 244 temporarily stores a plurality of substrates. A substrate stored in the front buffer 242 is taken in or taken out by the index robot 144 and the transfer robot 224. In addition, a substrate stored in the rear buffer 244 is taken in or taken out by the transfer robot 224 and the first robot 552 to be described later.

The buffer robots 246 and 248 may be disposed on a side of the buffer chambers 242 and 244. According to an embodiment, a front buffer robot 246 may be disposed on a side of the front buffer 242, and a rear buffer robot 248 may be disposed on a side of the rear buffer 244. However, the inventive concept is not limited thereto, and buffer robots may be disposed on both sides of the front buffer 242 and the rear buffer 244, respectively.

The front buffer robot 246 transfers the substrate between the front buffers 242. More specifically, the front buffer robot 246 transfers the substrate between the front buffers 242 arranged to be stacked while moving along the third direction 6. In addition, the rear buffer robot 248 transfers the substrate between the rear buffers 244 arranged to be stacked while moving along the third direction 6.

The heat treating chamber 300 performs a heat treatment process on the substrate. The heat treatment process according to an embodiment may include a cooling process of lowering a temperature of the substrate and a heating process of increasing the temperature of the substrate. A plurality of heat treating chambers 300 may be provided. The heat treating chambers 300 are disposed along the first direction 2. In addition, the heat treating chambers 300 are arranged to be stacked in the third direction 6. The heat treating chambers 300 are positioned on a side of the transfer chamber 220.

The liquid treating chamber 400 performs a liquid treatment process on the substrate. A plurality of liquid treating chambers 400 may be provided. The liquid treating chambers 400 are disposed along the first direction 2. In addition, the liquid treating chambers 400 are arranged to be stacked in the third direction 6. The liquid treating chambers 400 are positioned on the other side of the transfer chamber 200. That is, the heat treating chamber 300 and the liquid treating chamber 400 are disposed to face each other based on the transfer chamber 220.

In addition, some of the plurality of liquid treating chambers 400 are disposed at a position adjacent to the index module 10. A liquid treating chamber 400 disposed at a position adjacent to the index module 10 may supply a first liquid onto the substrate. In addition, other portions of the plurality of liquid treating chambers 400 are disposed at positions adjacent to the interface module 50. An liquid treating chamber 400 disposed at a position adjacent to the interface module 50 may supply a second liquid onto the substrate. According to an embodiment, the first liquid may be an anti-reflection layer, and the second liquid may be a photoresist liquid. However, the inventive concept is not limited thereto, and the first liquid may be a photoresist liquid, and the second liquid may be an anti-reflection film. In this case, the anti-reflection layer may be supplied on the substrate to which the photoresist liquid is supplied. Selectively, both the first liquid and the second liquid may be the same type of liquid. In this case, the first liquid and the second liquid may be a photoresist liquid having different concentrations.

Figure 4:
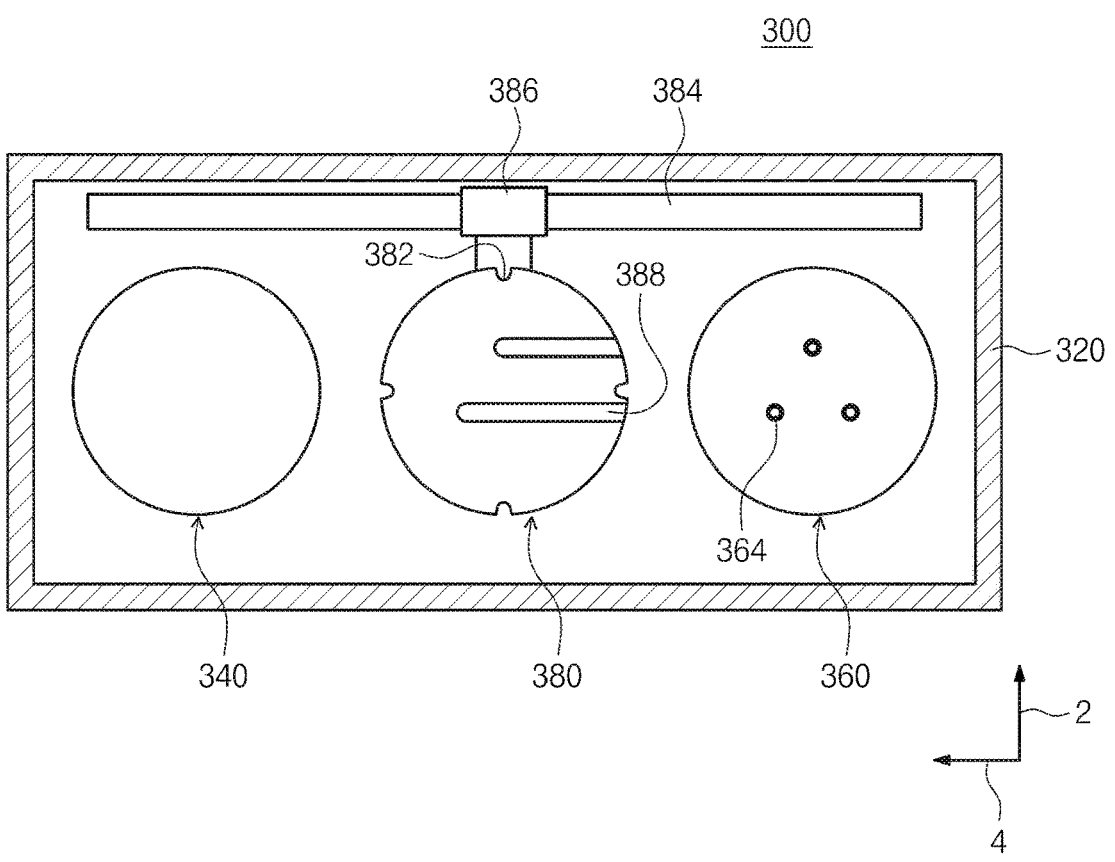
FIG. 4 is a plan view schematically illustrating a heat treating chamber according to an embodiment.
Figure 5:
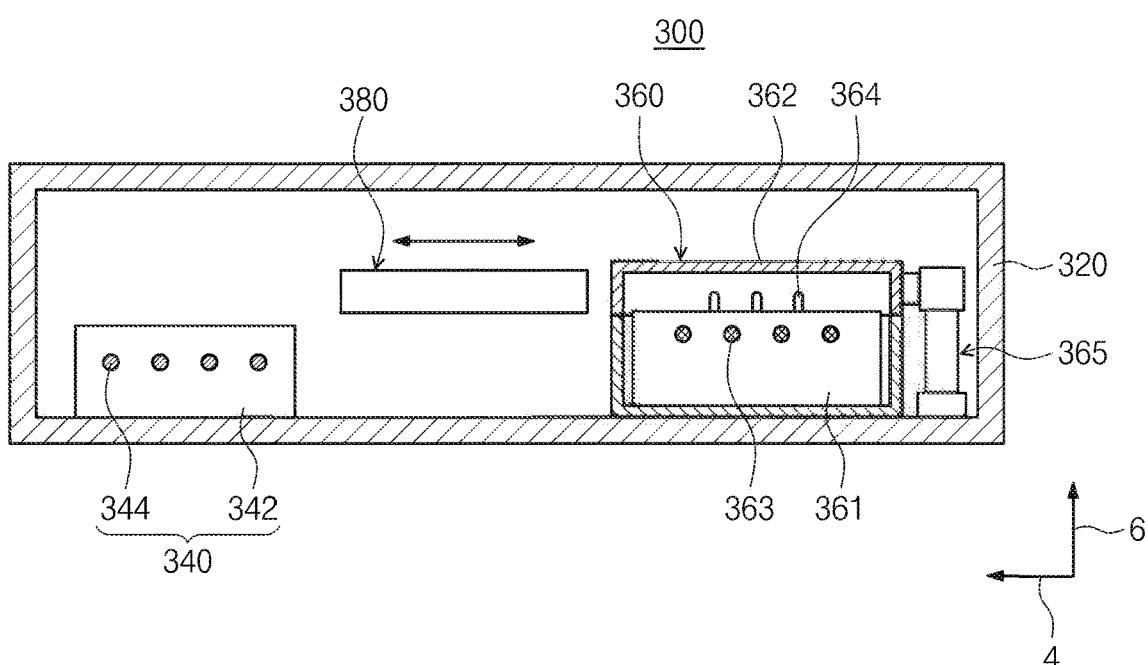
FIG. 5 is a front view schematically illustrating a heat treating chamber according to an embodiment.

FIG. 4 is a plan view schematically illustrating a heat treating chamber according to an embodiment. FIG. 5 is a front view schematically illustrating a heat treating chamber according to an embodiment.

The heat treating chamber 300 includes a housing 320, a cooling unit 340, a heating unit 360, and a transfer plate 380.

The housing 320 generally has a rectangular parallelepiped shape. An entrance (not shown) through which the substrate enters and exits is formed on the sidewall of the housing 320. A cooling unit 340, a heating unit 360, and a transfer plate 380 are positioned in an inner space of the housing 320. The cooling unit 340 and the heating unit 360 are positioned side by side in the second direction 4.

According to an embodiment, the cooling unit 340 may be positioned closer to the transfer chamber 220 than the heating unit 360. The cooling unit 340 includes a cooling plate 342 and a cooling fluid channel 344. The cooling plate 342 may have a substantially circular shape when viewed from above. The cooling fluid channel 344 is positioned inside the cooling plate 342. A cooling fluid may flow through the cooling fluid channel 344. As the cooling fluid flows through the cooling fluid channel 344, a temperature of the cooling plate 342 may be lowered.

The heating unit 360 may include a heating plate 361, a cover 362, and a heater 363.

The heating plate 361 may have a circular shape when viewed from above. The heating plate 361 may have a diameter larger than that of the substrate. A heater 363 is disposed inside the heating plate 361. The heater 363 may be any one of known heating resistors which generate a heat by resisting a current.

A plurality of lift pins 364 moving up and down along the third direction 6 are disposed on the heating plate 361. The lift pins 364 may receive the substrate from a transfer means (e.g., transfer plate 380) outside the heating unit 360, and may put the substrate down on the heating plate 361. In addition, the lift pins 364 may lift the substrate from the heating plate 361 and transfer the substrate to a transfer means outside the heating unit 360.

The cover 362 has a shape in which a bottom portion is opened. The cover 362 is positioned above the heating plate 361 and can be moved in the vertical direction by the driver 365 coupled to the cover 362. The driver 365 may be any one of known motors which transfer a driving force. The cover 362 is downwardly moved by the driver 365, and a space formed by combining the cover 362 and the heating plate 361 may function as a heating space for heating the substrate.

The transfer plate 380 generally has a disk shape. In addition, the transfer plate 380 may have a diameter corresponding to the substrate. A notch 382 is formed at an edge of the transfer plate 380. In addition, a plate driver 386 may be coupled to the transfer plate 380. The plate driver 386 is mounted on the rail 384 having a lengthwise direction horizontal to the second direction 4. Accordingly, the transfer plate 380 may be linearly moved along the rail 384 by the plate driver 386.

In addition, a plurality of slit-shaped guide grooves 388 are formed in the transfer plate 380. The guide groove 388 extends from an end of the transfer plate 380 to an inside of the transfer plate 380. The guide groove 388 has a lengthwise direction horizontal to the second direction 4, and the plurality of guide grooves 388 are formed to be spaced apart along the first direction 2. If the substrate is taken over and handed over between the transfer plate 380 and the heating unit 360, the transfer plate 380 and the lift pin 364 can be prevented from interfering with each other by the guide groove 388 formed in the transfer plate 380.

The transfer plate 380 transfers the substrate to the lift pin 364, and the lift pin 364 downwardly moves to mount the substrate on the heating plate 361. A temperature of the substrate mounted on the heating plate 361 may be increased by a heat generation of the heater 363. In addition, the transfer plate 380 may be in contact with the cooling plate 342. More specifically, if the substrate is placed on a top side of the transfer plate 380, the transfer plate 380 may contact the cooling plate 342. The temperature of the substrate mounted on the transfer plate 380 may be lowered by a cooling fluid flowing through the cooling fluid channel 344.

In addition, according to an embodiment, the heating unit 360 provided in some of the plurality of heat treating chambers 300 may improve an adhesion rate of the photoresist liquid to the substrate by supplying a gas while heating the substrate. According to an embodiment, the gas may be a hexamethyldisilane.

Figure 6:
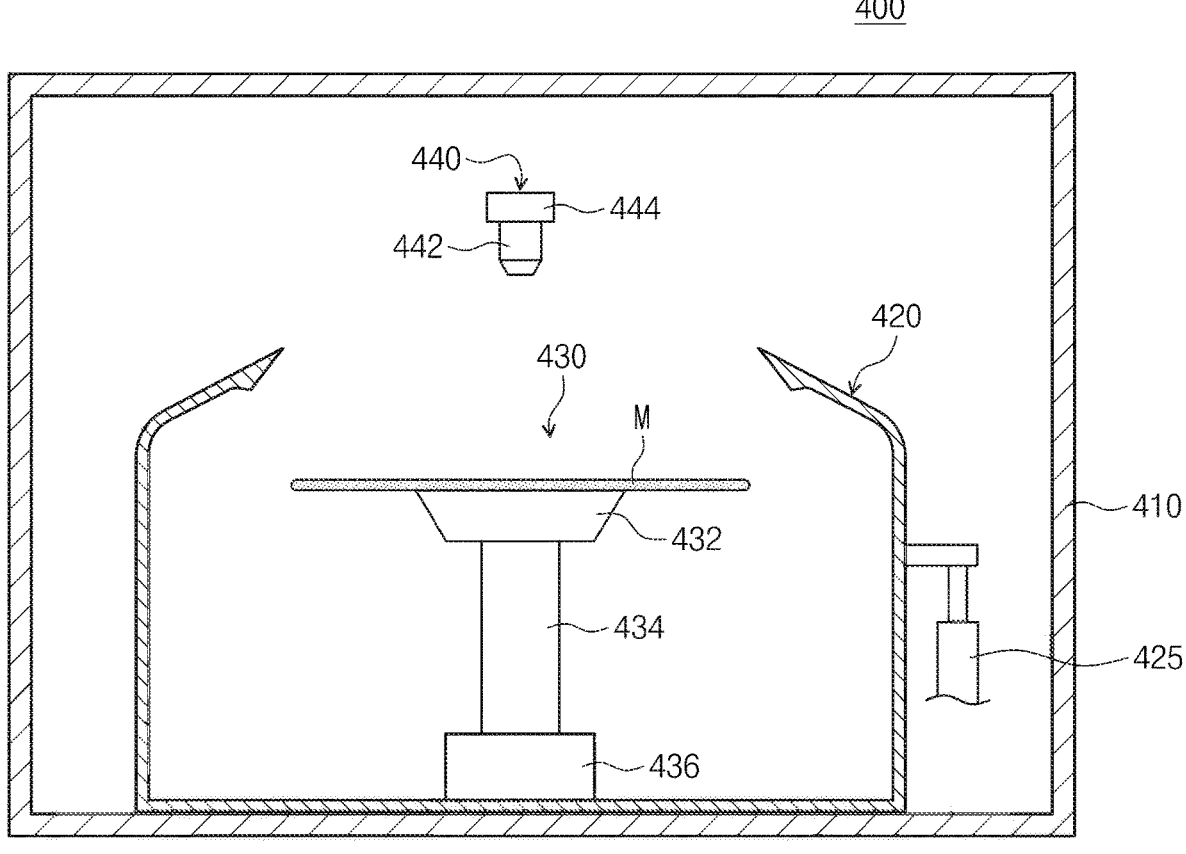
FIG. 6 is a cross-sectional view schematically illustrating a liquid treating chamber according to an embodiment.

FIG. 6 is a cross-sectional view schematically illustrating a liquid treating chamber according to an embodiment.

The liquid treating chamber 400 may include a housing 410, a cup body 420, a support 430, and a liquid supply unit 440.

The housing 410 may have a substantially rectangular parallelepiped shape. The housing 410 has a space therein. The cup body 420 and the support 430 are positioned inside the housing 410. An inlet (not shown) through which the substrate W is taken in and out is formed on a sidewall of the housing 410.

The cup body 420 has a cup shape with an open top portion. The cup body 420 may surround the support 430 to be described later. More specifically, the cup body 420 may surround the support 430 and the substrate W supported by the support 430. The cup body 420 may generally have a ring shape. The cup body 420 may be coupled to a cup driver 425. The cup driver 425 lifts and lowers the cup body 420. The cup driver 425 according to an embodiment may be a motor. According to an embodiment, while treating the substrate W, the cup driver 425 may upwardly move the cup body 420. Accordingly, while treating the substrate W, a top end of the cup body 420 may be positioned higher than a top surface of the substrate W supported by the support 430. On the contrary, after a treating of the substrate W is completed, the cup driver 425 may downwardly move the cup body 420 so that the top end of the cup body 420 is positioned lower than a top surface of the substrate W supported by the support 430.

The support 430 supports and rotates the substrate W. The support 430 may include a support plate 432, a rotation shaft 434, and a support driver 436.

The substrate W is mounted on a top surface of the support plate 432. The top surface of the support plate 432 has a substantially circular shape when viewed from above. The top surface of the support plate 432 has a diameter smaller than that of the substrate W. The rotation shaft 434 is coupled to a bottom end of the support plate 432. A rotation axis 434 has a lengthwise direction parallel to the third direction 6. The rotation shaft 434 is coupled to the support driver 436. The rotation shaft 434 may rotate by receiving a power from the support driver 436.

The liquid supply unit 440 supplies a liquid to the substrate W supported by the support 430. The liquid according to an embodiment may include a coating liquid. For example, the coating liquid may be at least one of a photosensitive liquid such as a photoresist liquid (PR), a liquid forming an anti-reflection film on the substrate W, and a prewet liquid which changes a surface property of the substrate W so that the surface of the substrate W has a hydrophobic property.

The liquid supply unit 440 may include a nozzle 442 and a nozzle arm 444. The nozzle 442 supplies a liquid to the substrate W. Although FIG. 6 shows that there is one nozzle 442, the inventive concept is not limited thereto. For example, at least one nozzle 442 may be provided. Each of the nozzles 442 may supply different liquids to the substrate W. In addition, each nozzle 442 may supply the same liquid to the substrate W, but may supply a liquid having different composition ratios to the substrate W.

The nozzle arm 444 supports the nozzle 442. The nozzle 442 is installed at an end of the arm 444. The nozzle arm 444 may be coupled to a driver not shown and its position may be changed. Accordingly, positions of the nozzles 442 may also be changed.

Referring back to FIG. 1 to FIG. 3, the interface module 50 connects the treating module 20 to an outer exposure apparatus 90. The interface module 50 includes an interface frame 510, an interface buffer 530, a transfer unit 550, and an additional process chamber 570.

The interface buffer 530, the transfer unit 550, and the additional process chamber 570 are positioned inside the interface frame 510. The interface buffer 530 provides a space in which the substrate is temporarily stored in a process of transferring the substrate between the coating block 20*a*, the additional process chamber 570, the exposure apparatus 90, and the developing block 20*b*. A plurality of interface buffers 530 may be provided, and the plurality of interface buffers 530 may be disposed to be stacked on each other.

The transfer unit 550 transfers the substrate between the coating block 20*a*, the additional process chamber 570, the exposure apparatus 90 or the developing block 20*b*. The transfer unit 550 includes at least one robot. According to an embodiment, the transfer unit 550 may include a first robot 552, a second robot 554, and a third robot (not shown).

The first robot 552 may transfer the substrate between the coating block 20*a*, the additional process chamber 570, and the exposure apparatus 90. More specifically, the first robot 552 may transfer the substrate between the rear buffer 244, the additional process chamber 570, and the exposure apparatus 90. In addition, the second robot 554 may transfer the substrate between the interface buffer 530 and the exposure apparatus 90. The third robot, which is not shown, may transfer the substrate between the interface buffer 530 and the developing block 20b. Each of the first robot 552, the second robot 554, and the third robot (not shown) may include a hand on which a substrate is placed. Each hand may move forward and backward, rotate around an axis parallel to the third direction 6, and vertically move along the third direction 6.

The additional process chamber 570 may perform a predetermined additional process before the substrate which has completed a predetermined process at the coating block 20a is taken into the exposure apparatus 90. In addition, the additional process chamber 570 may perform a predetermined additional process before the substrate that has been treated by the exposure apparatus 90 is taken into the developing block 20b.

A plurality of additional process chambers 570 may be provided. In addition, the plurality of additional process chambers 570 may be disposed to be stacked on each other. All of the additional process chambers 570 may perform the same process. Selectively, the additional process chambers 570 may perform different processes. For example, in some of the plurality of additional process chambers 570, an additional process according to an embodiment be performing an edge exposure process of exposing an edge region of the substrate. In addition, in other parts of the plurality of additional process chambers 570, a top surface cleaning process of cleaning a top surface of the substrate may be performed. In addition, in another part of the plurality of additional process chambers 570, a bottom surface cleaning process of cleaning a bottom surface of the substrate may be performed.

Hereinafter, it will be described as an example that the additional process chamber 570 according to an embodiment is a bottom surface cleaning chamber 600 for cleaning the bottom surface of the substrate.

Figure 7:
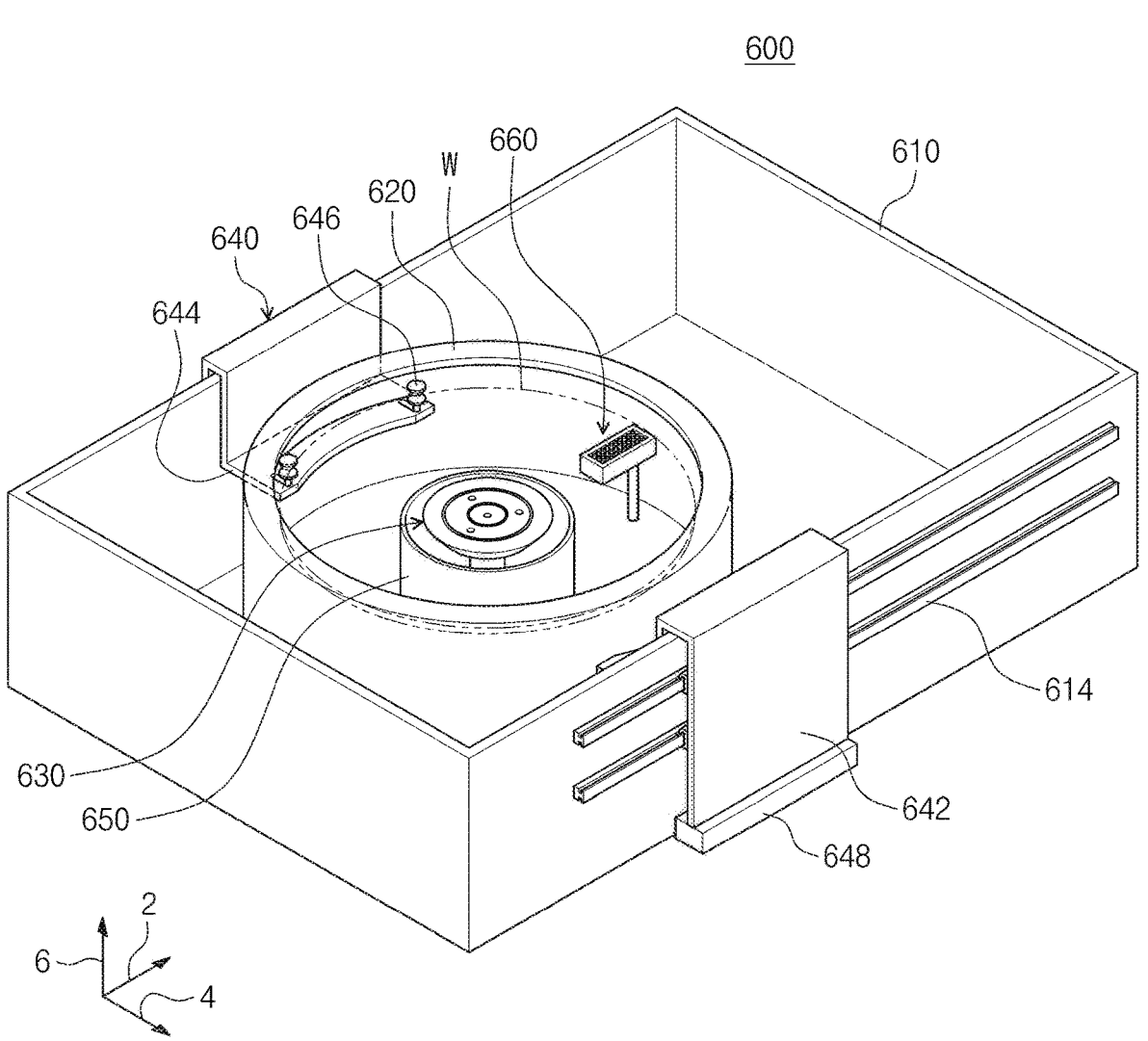
FIG. 7 is a perspective view schematically illustrating a bottom surface cleaning chamber according to an embodiment.
Figure 8:
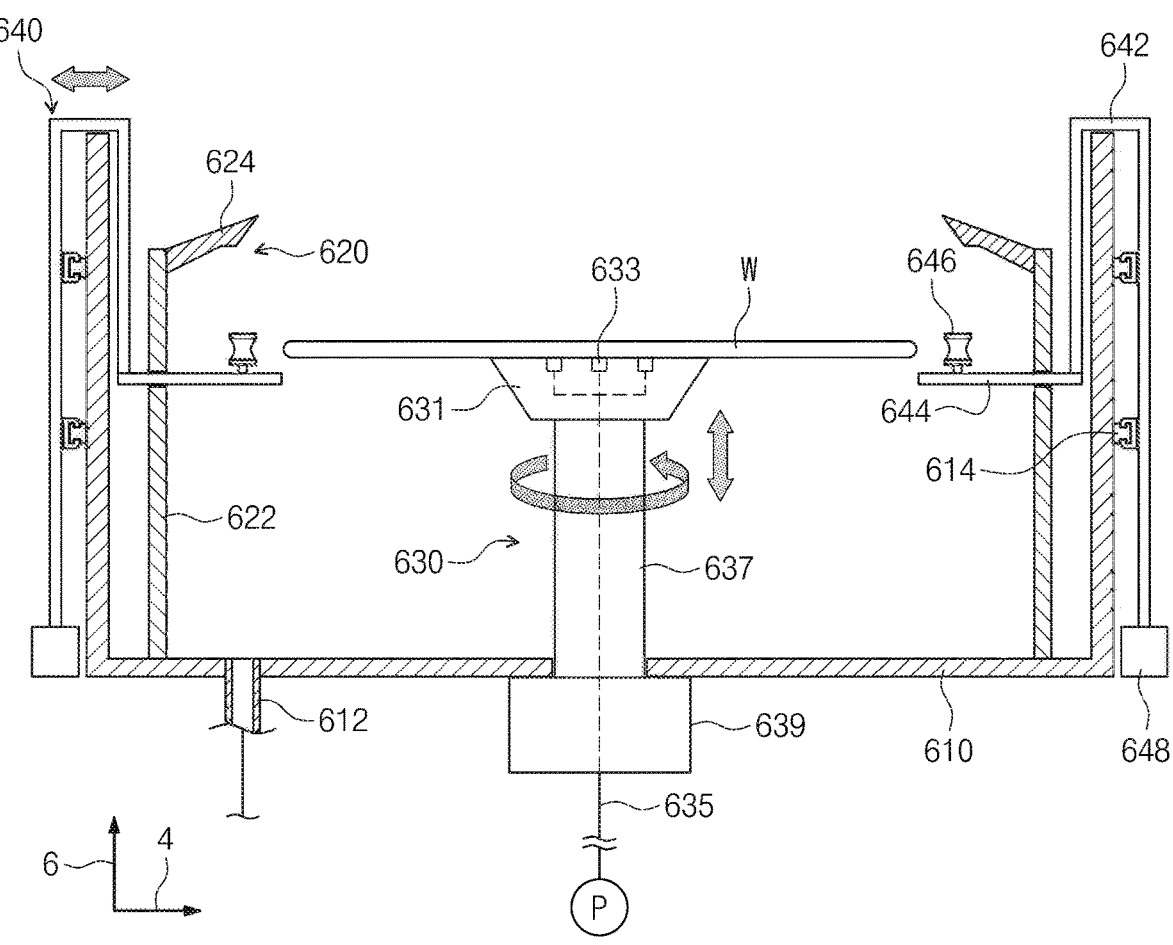
FIG. 8 is a cross-sectional view schematically showing a bottom surface cleaning chamber according to an embodiment.
Figure 9:
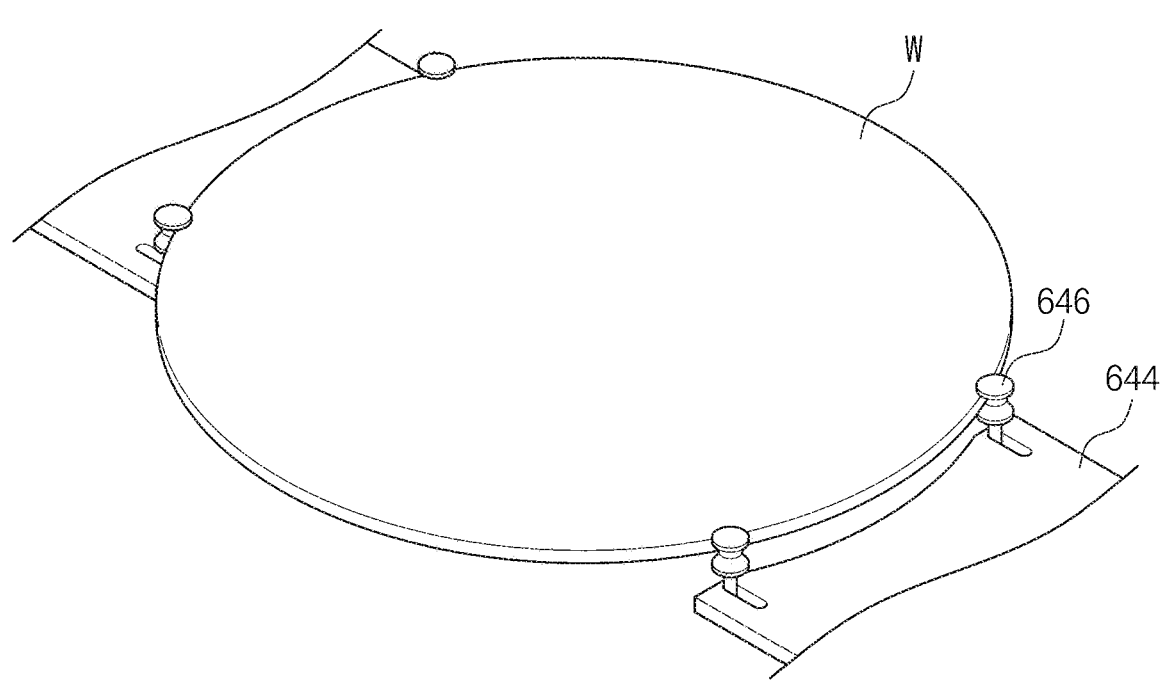
FIG. 9 is a perspective view schematically illustrating a state in which a second support unit supports a substrate according to an embodiment.

FIG. 7 is a perspective view schematically illustrating a bottom surface cleaning chamber according to an embodiment. FIG. 8 is a cross-sectional view schematically showing a bottom surface cleaning chamber according to an embodiment. FIG. 9 is a perspective view schematically illustrating a state in which a second support unit supports a substrate according to an embodiment.

The bottom surface cleaning chamber 600 may include a housing 610, a treating container 620, support units 630 and 640, and a cleaning unit 660.

The housing 610 generally has a rectangular parallelepiped shape. According to an embodiment, the top portion of the housing 610 may be opened. The open top portion of the housing 610 may be sealed by a cover which is not shown. A treating container 620, support units 630 and 640, and a cleaning unit 660 to be described later are positioned inside the housing 610. An exhaust hole (not shown) may be formed at a bottom of the housing 610. The exhaust hole (not shown) may be connected to an exhaust line (not shown) on which a pump is installed to adjust an inner pressure of the housing 610. In addition, the exhaust hole (not shown) may discharge foreign substrances floating inside the housing 610 to the outside of the housing 610. In addition, a recollecting line 612 is connected to the bottom of the housing 610. The recollecting line 612 may recollect a cleaning liquid supplied from the cleaning liquid supply unit 680 to the bottom surface of the substrate W to be described later. The cleaning liquid recollected by the recollecting line 612 may be reused in an outer regeneration system (not shown).

A guide rail 614 is installed on a sidewall of the housing 610. A plurality of guide rails 614 may be provided. Some of the plurality of guide rails 614 are disposed on the sidewall of the housing 610, and others of the plurality of guide rails 614 are disposed on the other sidewall facing the sidewall of the housing 610. The guide rail 614 may have a lengthwise direction parallel to the first direction 2.

The treating container 620 may be a bowl with an open top portion. That is, the treating container 620 may have a cup shape with an open top. In addition, the treating container 620 may generally have a ring shape. An inside of the treating container 620 functions as a treating space in which the substrate W is treated. The treating container 620 may surround the substrate W supported by the first support unit 630 or the substrate W supported by the second support unit 640 to be described later.

The treating container 620 may include a side portion 622 and an inclined portion 624. The side portion 622 and the inclined portion 624 are integrally formed. In addition, the side portion 622 and the inclined portion 624 may be made of the same material. The side portion 622 has a ring shape. The side portion 622 may upwardly extend from the bottom of the housing 610. The side portion 622 may surround a chuck 631, a support shaft 637, and a cleaning unit 660 to be described later when viewed from above. An inner surface of the side portion 622 has a diameter larger than that of the substrate W. A groove is formed in the side portion 622. A plate 644 to be described later is inserted into the groove formed in the side portion 622.

The inclined portion 624 generally has a ring shape. The inclined portion 624 upwardly extends from an end of the side portion 622 along a circumferential direction of the side portion 622. The inclined portion 624 extends toward a center of the substrate W supported by the first support unit 630 or the second support unit 640. In addition, the inclined portion 624 may be upwardly inclined with respect to the ground toward a top end thereof. The top end of the inclined portion 624 may be positioned higher than the top surface of the substrate W supported by the first support unit 630 or the second support unit 640.

The support units 630 and 640 support the substrate W. More specifically, the support units 630 and 640 support the bottom surface of the substrate W. The bottom surface of the substrate W to be described below may mean a surface on which a pattern is not formed. On the contrary, the top surface of the substrate W may mean a surface on which the pattern is formed. In addition, the support units 630 and 640 may rotate the substrate W. The support units 630 and 640 include a first support unit 630 and a second support unit 640.

The first support unit 630 supports a central region of the substrate W. More specifically, the first support unit 630 supports the central region of the substrate W among the central region and the edge region of the substrate W, but exposes the edge region of the substrate W. The second support unit 640 supports the edge region of the substrate W. More specifically, the second support unit 640 supports the edge region of the substrate W among the central region and the edge region of the substrate W, but exposes the central region of the substrate W. Hereinafter, a central region of an entire bottom surface region of the substrate W may be referred to as a first region. In addition, an edge region of the entire bottom surface region of the substrate W may be referred to as a second region.

The first support unit 630 may include a chuck 631, an adsorption groove 633, a vacuum line 635, a support shaft 637, and an axis driver 639.

The substrate W is mounted on the top surface of the chuck 631. The chuck 631 has a substantially circular shape when viewed from above. The chuck 631 has a diameter smaller than that of the substrate W. The adsorption groove 633 may be formed at a top portion of the chuck 631. The adsorption groove 633 may be formed in a central region of the chuck 631 and an edge region of the chuck, respectively. The adsorption groove 633 formed in the central region of the chuck 631 may have a substantially circular shape when viewed from above. In addition, the adsorption groove 633 formed in the edge region of the chuck 631 may generally have a ring shape. The adsorption groove 633 is connected to the chuck 631 and a vacuum line 635 disposed inside a support shaft 637 to be described later. The vacuum line 635 is connected to a pump applying a negative pressure. Accordingly, the adsorption groove 633 fixes the substrate W mounted on a top surface of the chuck 631 to the chuck 631 in a vacuum adsorption manner. However, unlike the above-described example, the adsorption groove 633 may not be formed in the edge region of the chuck 631.

The support shaft 637 is coupled to the chuck 631. More specifically, the support shaft 637 is coupled to a bottom end of the chuck 631. The support shaft 637 has its lengthwise direction in the vertical direction (e.g., the third direction 6). The support shaft 637 is coupled to the shaft driver 639. The shaft driver 639 rotates the support shaft 637 with an axial direction of the support shaft 637 as a rotation axis. The shaft driver 639 may be any one of known motors which transmits a rotational force. In addition, the shaft driver 639 may move the support shaft 637 in the vertical direction. Accordingly, the substrate W mounted on the chuck 631 may rotate about the third direction 6 and the third direction 6.

The second support 640 may include a bracket 642, a plate 644, and a rotating pin 646.

The bracket 642 generally has a 'U' shape. The bracket 642 is positioned on the sidewall of the housing 610. In addition, the bracket 642 is disposed on the guide rail 614. The bracket 642 is coupled to a plate 644 to be described later. In addition, the bracket 642 is coupled to the bracket driver 648. The bracket driver 648 moves the bracket 642 along the guide rail 614. Accordingly, the plate 644 may move linearly along the guide rail 614 with the bracket 642 as a medium. For example, the plate 644 may forwardly and backwardly move in the first direction 2.

In addition, the bracket driver 648 may forwardly and backwardly move the bracket 642 in a direction toward the substrate W. For example, the bracket driver 648 may move the bracket 642 in the second direction 4.

The plate 644 is coupled to an end of the bracket 642. The plate 644 is inserted into a groove formed in the side portion 622. Accordingly, if the plate 644 moves in the first direction 2, the treating container 620 may also move in the first direction 2. On the contrary, if the plate 644 moves in the second direction 4, a movement of the plate 644 may not be restricted by the treating container 620. A rotating pin 646 is installed on a top end of the plate 644.

The rotating pin 646 supports a side end of the substrate W. The rotating pin 646 has its lengthwise direction parallel to the third direction 6. The rotating pin 646 rotates with respect to a reference axis in the third direction 6 by a driver which is not shown. The rotating pin 646 has a substantially circular shape when viewed from above. The rotating pin 646 may include a top portion and a bottom portion. The top portion and the bottom portion of the rotating pin 646 are integrally formed and may be made of the same material. For example, the top portion of the rotating pin 646 may have a shape in which a diameter decreases from a top to a bottom. In addition, the bottom portion of the rotating pin 646 may have a shape in which the diameter increases from the top to the bottom. A side end of the substrate W may be gripped at a point at which the top portion and the bottom portion of the rotating pin 646 are connected. The substrate W may be rotated by rotating the rotating pin 646 with the third direction 6 as a reference axis while the side end of the substrate W is gripped.

The gas supply unit 650 injects a gas to the bottom surface of the substrate W. More specifically, the gas supply unit 650 sprays the gas to the bottom surface of the substrate W supported by the first support unit 630. The gas supply unit 650 is positioned at a lower height than the chuck 631. In addition, the gas supply unit 650 is positioned between the chuck 631 and a side portion 622 of the treating container 620. In addition, the gas supply unit 650 is disposed to surround an outer side of the chuck 631. The gas supply unit 650 may have a cylindrical shape with an open top portion. A groove for supplying a gas may be formed at a top end of the gas supply unit 650. The groove to which the gas is supplied may be a ring-shaped slit. The top end of the gas supply unit 650 may be formed to be inclined toward an edge region of the substrate W supported by the first support unit 630. The gas according to an embodiment may be an air.

The cleaning unit 660 cleans the bottom surface of the substrate W supported by the support units 630 and 640. According to an embodiment, the second region of the substrate W is cleaned while the first region of the substrate W is supported by the first support unit 630. In addition, the first region of the substrate W is cleaned while the second region of the substrate W is supported by the second support 640. The cleaning unit 660 is positioned inside the treating container 620. In addition, the cleaning unit 660 is positioned outside the first support unit 630 and the gas supply unit 650.

Figure 10:
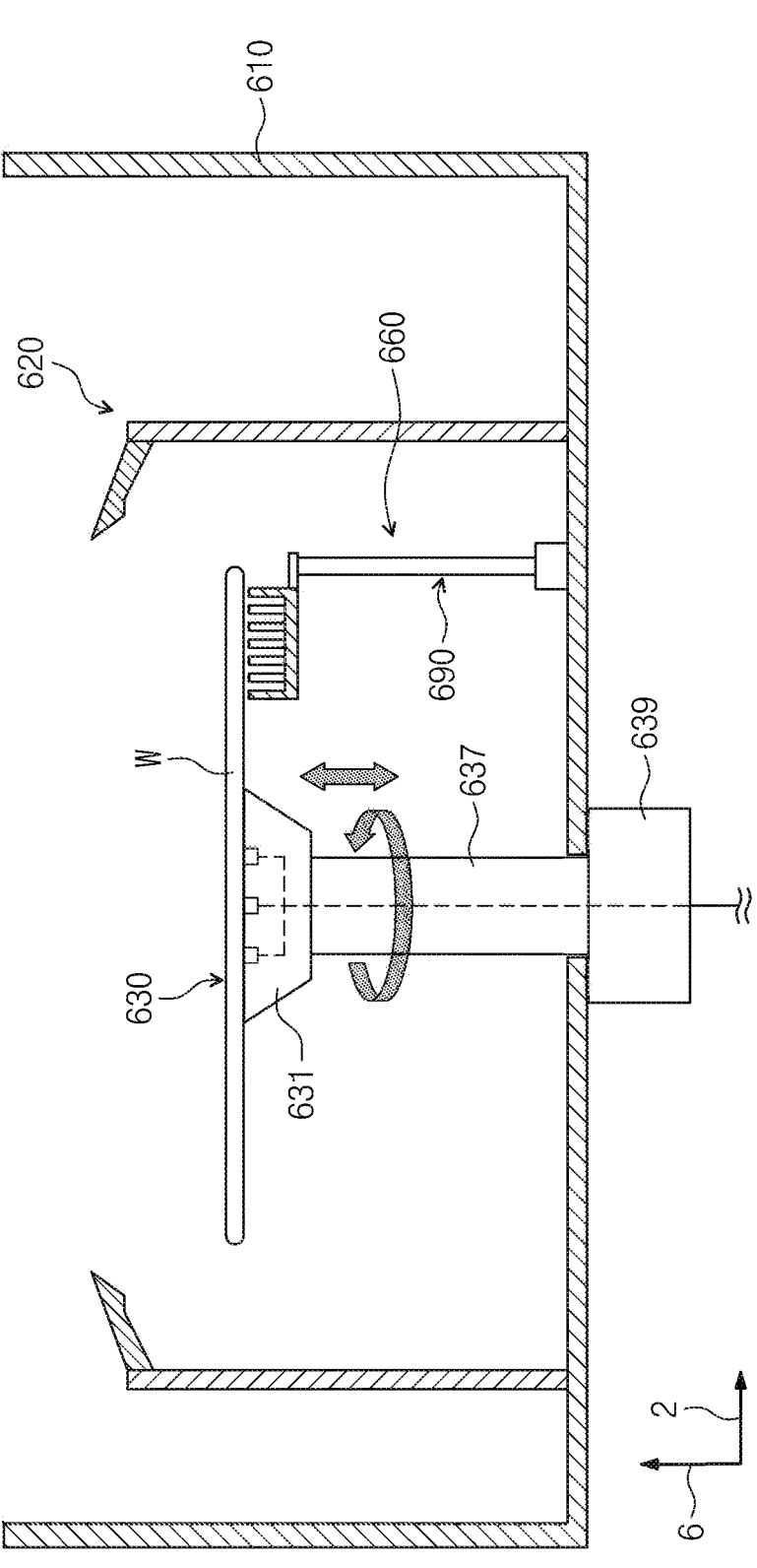
FIG. 10 is a cross-sectional view schematically showing a bottom surface cleaning chamber according to an embodiment.
Figure 11:
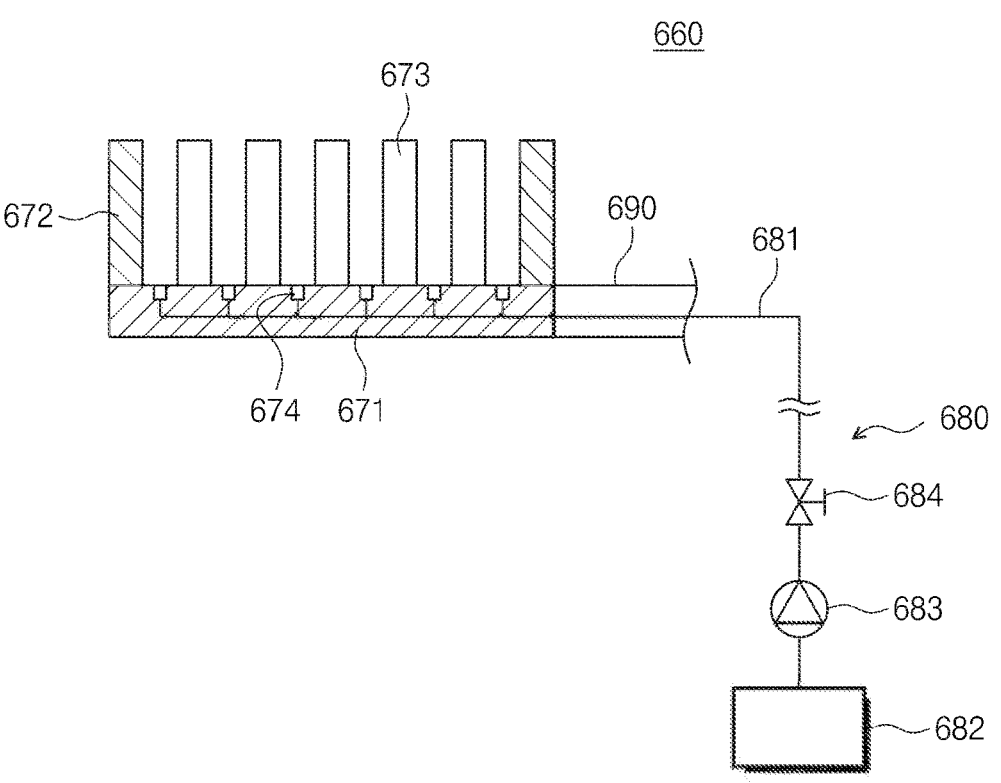
FIG. 11 is a cross-sectional view schematically showing a cleaning unit according to an embodiment.
Figure 12:
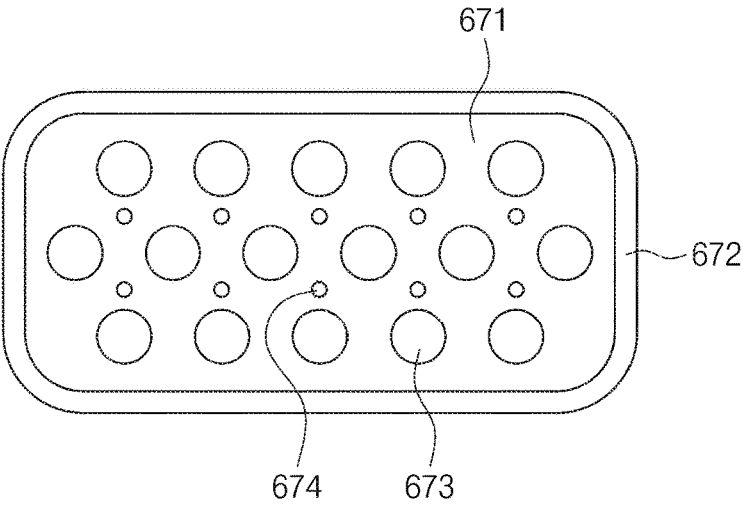
FIG. 12 schematically illustrates a cleaning unit viewed from above according to an embodiment.

FIG. 10 is a cross-sectional view schematically showing a bottom surface cleaning chamber according to an embodiment. FIG. 11 is a cross-sectional view schematically showing a cleaning unit according to an embodiment. FIG. 12 schematically illustrates a cleaning unit viewed from above according to an embodiment.

The cleaning unit 660 may include a body 671, a sidewall 672, a protrusion 673, a hole 674, a cleaning liquid supply unit 680, and an arm 690.

The body 671 may have a plate shape with rounded corners. However, the inventive concept is not limited thereto, and the body 671 may be formed in a plate shape having angular edges. In addition, the shape of the body 671 is not limited to the above-described example, and may be transformed into various shapes (e.g., a circle shape). With the first support unit 630 supporting the first region of the substrate W, the body 671 may be positioned at a position overlapping the second region of the substrate W when viewed from above. An arm 690 to be described later may be coupled to a side of the body 671.

The sidewall 672 upwardly extends from the body 671. In addition, the sidewall 672 is formed in an edge region of the body 671. In addition, the sidewall 672 is formed along a circumferential direction of the body 671. The body 671 and the sidewall 672 are integrally formed and may be made of the same material. According to an embodiment, the body 671 and the sidewall 672 may be made of a flexible material. For example, the body 671 and the sidewall 672 may be made of a material including a polyvinyl alcohol (PVA).

The protrusion 673 is positioned in a space surrounded by the sidewall 672. That is, the protrusion 673 is positioned at an inner side the sidewall 672. In addition, the protrusion 673 is disposed to be spaced apart from the sidewall 672. In addition, the protrusion 673 is formed to upwardly protrude from the body 671. According to an embodiment, the protrusion 673 may have a protrusion shape. For example, the protrusion 673 may be a brush having a plurality of protrusion shapes. The protrusion 673 may have a bundle structure in which the plurality of protrusion shapes are spaced apart from each other at regular intervals. According to an embodiment, the protrusion 673 may be made of the same or similar material as the body 671 and the sidewall 672. For example, the protrusion 673 may be made of a material including a PVA.

As shown in FIG. 11, a top end of the sidewall 672 and a top end of the protrusion 673 may be formed to be rounded. In addition, the end of the protrusion 673 may be formed to be rounded.

The hole 674 is formed in the body 671. More specifically, the hole 674 is formed at a top portion of the body 671. The hole 674 penetrates the top surface of the body 671. The hole 674 is positioned in a space surrounded by the sidewall 672. A plurality of holes 674 may be formed in the body 671. The plurality of holes 674 are disposed to be spaced apart from each other. In addition, each of the plurality of holes 674 are disposed so as not to overlap the protrusion 673 when viewed from above. That is, the hole 674 and the protrusion 673 are disposed to not overlap which other when seen from above.

The cleaning liquid supply unit 680 supplies the cleaning liquid. More specifically, the cleaning liquid supply unit 680 supplies the cleaning liquid to the bottom surface of the substrate W supported by the first support unit 630 or the second support unit 640. The cleaning liquid according to an embodiment may include at least one of a deionized water, an ozone water, a hydrogen water, or an ammonia water. The cleaning liquid may be determined in consideration of the characteristics of the liquid supplied to the substrate W in the pre-treatment step.

The cleaning liquid supply unit 680 may include a supply line 681, a source 682, a pump 683, and a valve 684.

The supply line 681 is disposed to penetrate an inside of the body 671 and the arm 690. In addition, an end of the supply line 681 is connected to the hole 674. The other end of the supply line 681 is connected to the source 682 storing the cleaning liquid. According to an embodiment, the source 682 may be positioned outside the treating container 620. A pump 683 and a valve 684 are installed in the supply line 681. The pump 683 transmits a flow pressure into the supply line 681. The valve 684 may be an on/off valve and/or a flow control valve. The cleaning liquid stored in the source 682 may be supplied to the bottom surface of the substrate W through the supply line 681 and the hole 674 sequentially.

The arm 690 is coupled to the body 671. According to an embodiment, the arm 690 is coupled to a side end of the body 671. However, the inventive concept is not limited thereto, and the arm 690 may be coupled to a bottom end of the body 671. In addition, the arm 690 is installed on a bottom of the housing 610. The arm 690 is coupled to the body 671 to support the body 671.

Hereinafter, a substrate treating method according to an embodiment will be described. The substrate treating method described below may be performed by the substrate treatment apparatus described with reference to FIG. 1 to FIG. 12. Accordingly, hereinafter, the substrate treating method according to an embodiment will be described by citing reference numbers shown in FIG. 1 to FIG. 12. In addition, the substrate treating method described below may be performed by controlling components included in the substrate treating apparatus, which are not shown.

The controller (not shown) may comprise a process controller consisting of a microprocessor (computer) that executes a control of the substrate treating apparatus 1, a user interface such as a keyboard via which an operator inputs commands to manage the substrate treating apparatus 1, and a display showing the operation situation of the substrate treating apparatus 1, and a memory unit storing a treating recipe, i.e., a control program to execute treating processes of the substrate treating apparatus 1 by controlling the process controller or a program to execute components of the substrate treating apparatus 1 according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

Figure 13:
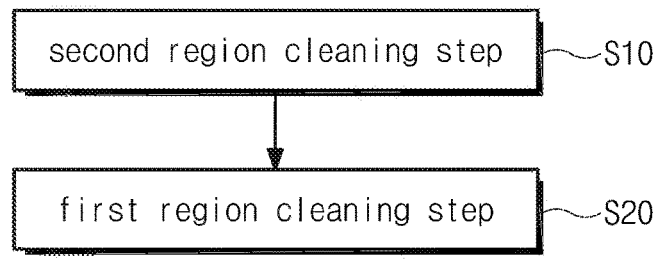
FIG. 13 is a flowchart of a substrate treating method according to an embodiment.
Figure 14:
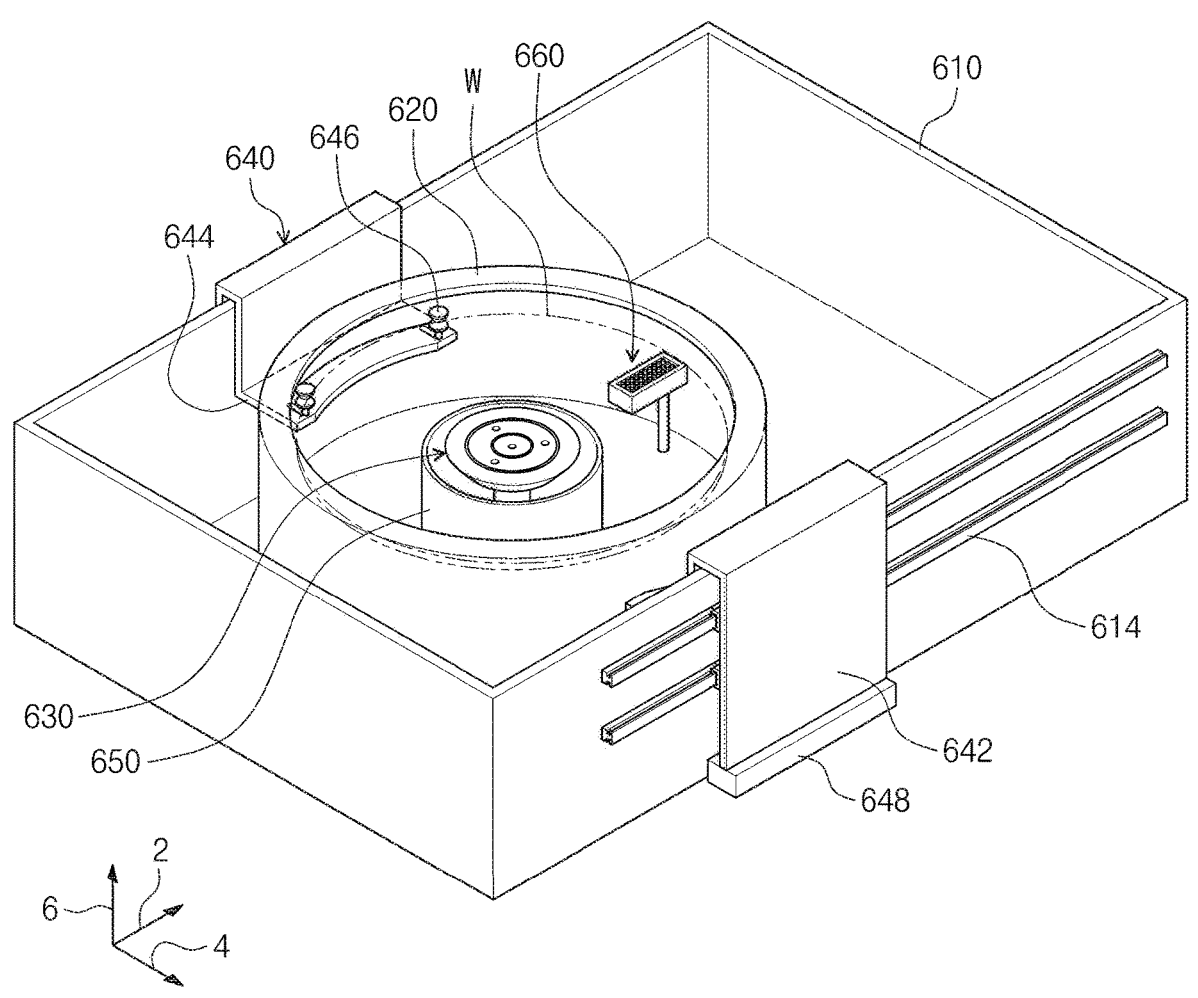
FIGS. 14 to 17 are views for explaining an operation of a substrate treating apparatus performing a first region cleaning step according to an embodiment.
Figure 18:
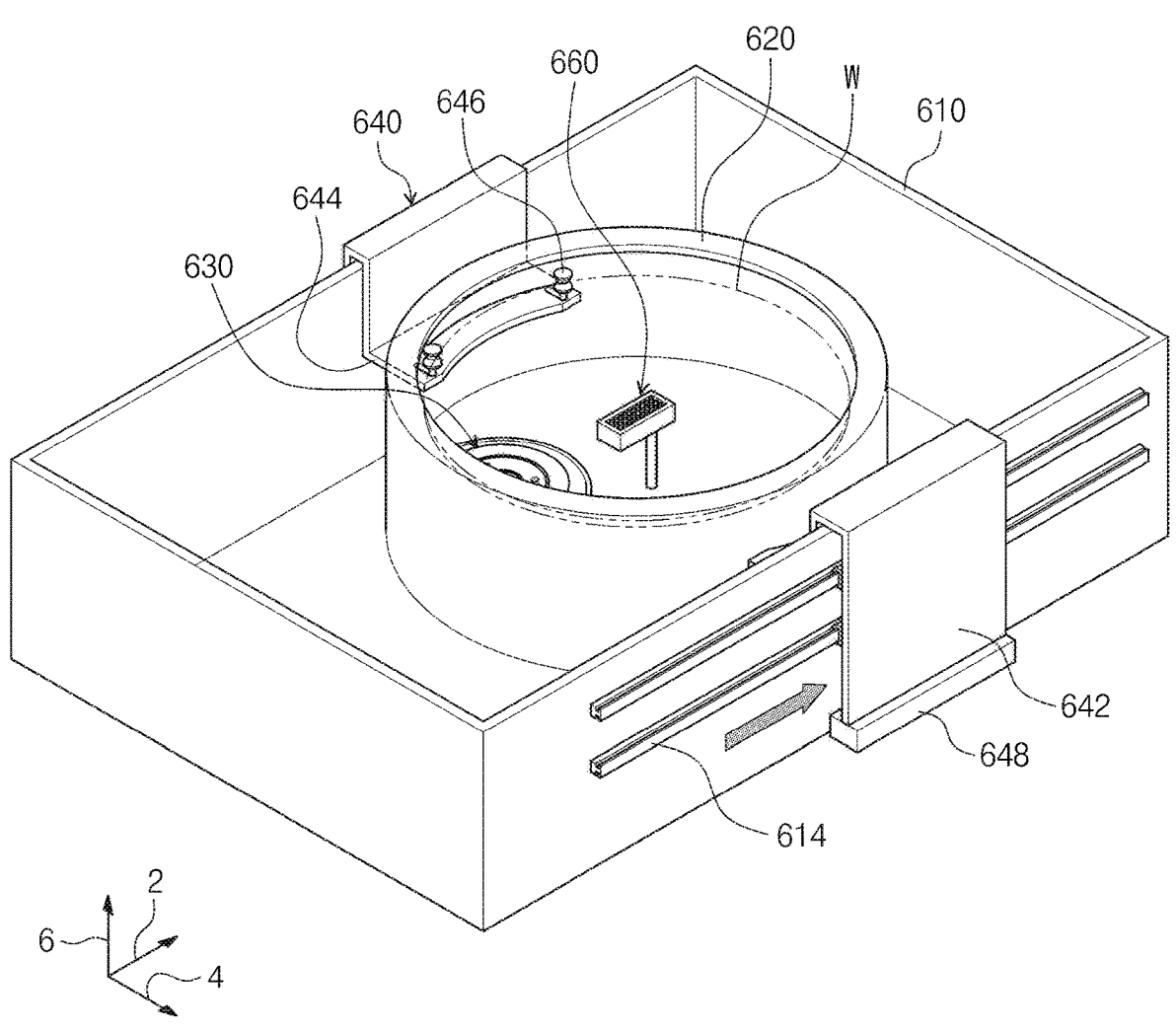
FIGS. 18 to 20 are views for explaining an operation of a substrate treating apparatus performing a second region cleaning step according to an embodiment.
Figure 19:
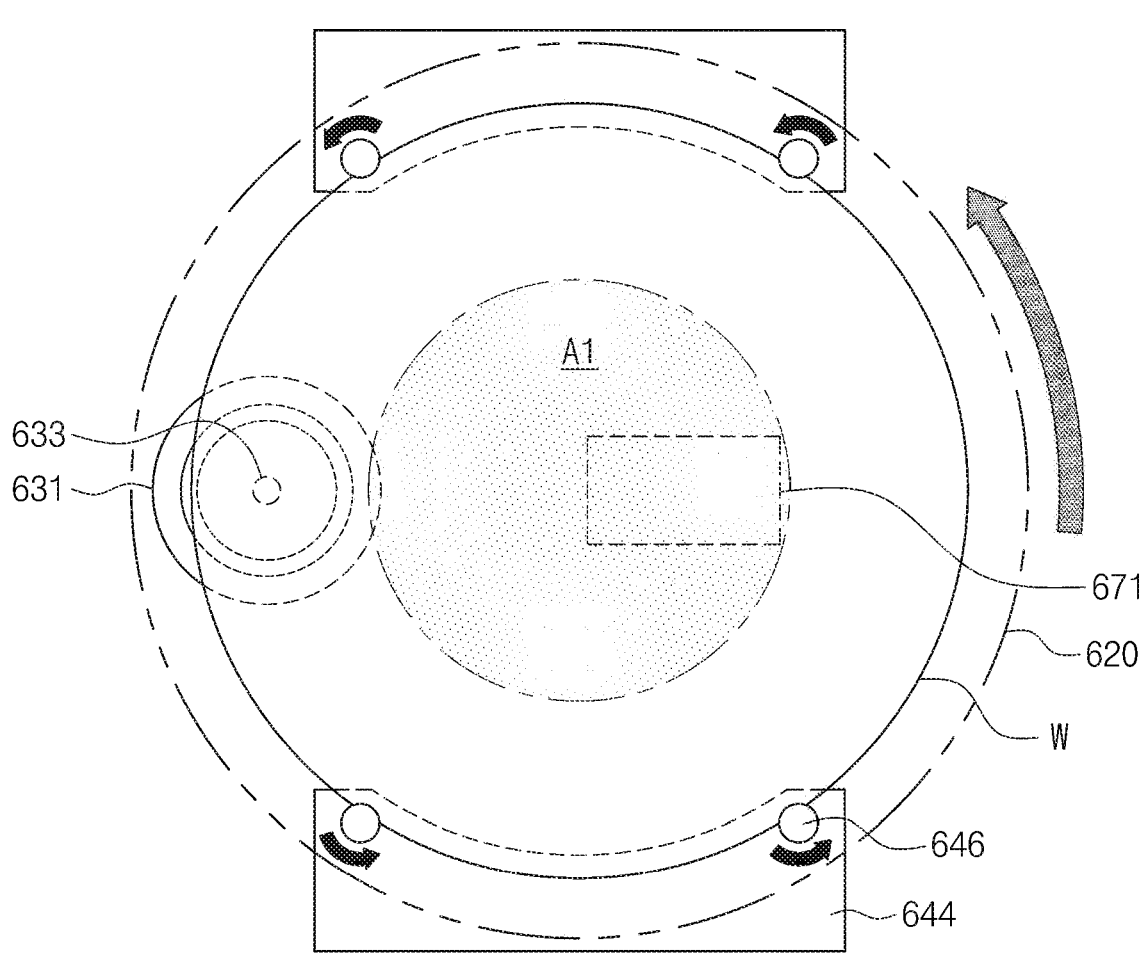
Figure 20:
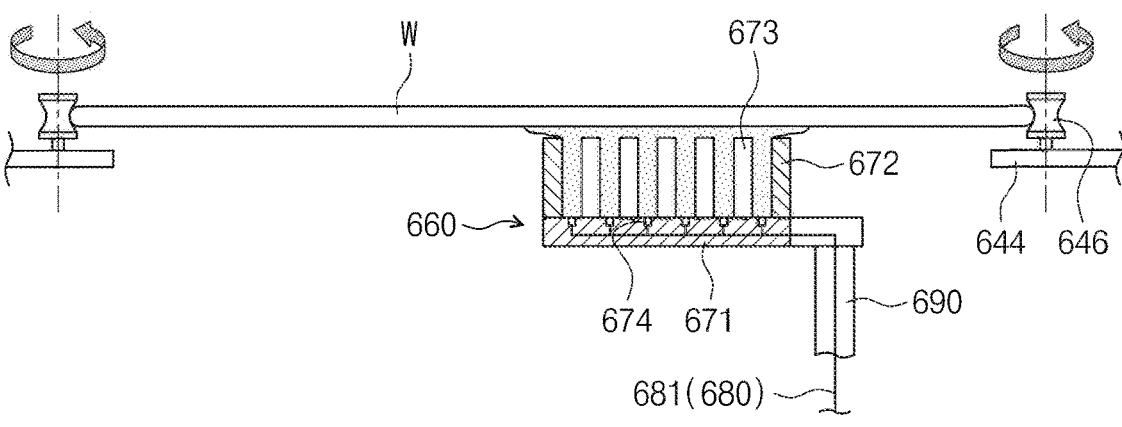

FIG. 13 is a flowchart of a substrate treating method according to an embodiment. FIG. 14 to FIG. 17 are views for explaining an operation of a substrate treating apparatus performing a first region cleaning step according to an embodiment. FIG. 18 to FIG. 20 are views for explaining an operation of the substrate treating apparatus performing a second region cleaning step according to an embodiment.

The substrate treating method according to an embodiment includes a second region cleaning step S10 and a first region cleaning step S20. The second region cleaning step S10 and the first region cleaning step S20 may be sequentially performed.

Before performing the second region cleaning step S10, an outer transfer means (e.g., the first robot 552) may hand over the substrate W to the first support unit 630. The substrate W handed over to the first support unit 630 may be a substrate W which has been pre-treated. For example, the substrate W handed over to the first support unit 630 may be the substrate W on which the coating process has been performed.

The chuck 631 upwardly moves so that the outer transfer means transfers the substrate W to the first support 630. Accordingly, the chuck 631 is positioned higher than the top end of the treating container 620. The outer transfer means transfers the substrate W to the top surface of the chuck 631, and the adsorption groove 633 fixes the substrate W mounted on the top surface of the chuck 631 in a vacuum adsorption method. Accordingly, the bottom surface of the substrate W is supported by the top surface of the chuck 631.

The first region A1 (e.g., the central region) of the substrate W is supported by the chuck 631, and the second region A2 (e.g., the edge region) of the substrate W is exposed. In addition, if the chuck 631 supports the first region A1 of the substrate W, the second region A2 of the substrate W may overlap the body 671 when viewed from above. The chuck 631 downwardly moves while supporting the first region A1 of the substrate W. According to an embodiment, the chuck 631 moves to a second region cleaning position.

The second region cleaning position may be a position at which the chuck 631 is at a height lower than the top end of the treating container 620. In addition, the second region cleaning position may be a position at which the bottom surface of the substrate W supported by the chuck 631 is spaced apart from each of the top of the sidewall 672 and the top of the protrusion 673 by a certain distance. More specifically, the second region cleaning position may be a position at which the bottom surface of the substrate W supported by the chuck 631 is 2 mm to 3 mm above the top surface of the sidewall 672. In addition, the second region cleaning position may be a position at which the bottom surface of the substrate W supported by the chuck 631 is 2 mm to 3 mm above a top surface of the protrusion 673. According to an embodiment, a separation distance between the top surface of the protrusion 673 and the bottom surface of the substrate W may be smaller than a separation distance between the top surface of the sidewall 672 and the bottom surface of the substrate W.

If the chuck 631 is completely moved to the second region cleaning position, the second region cleaning step S10 is performed.

Figure 15:
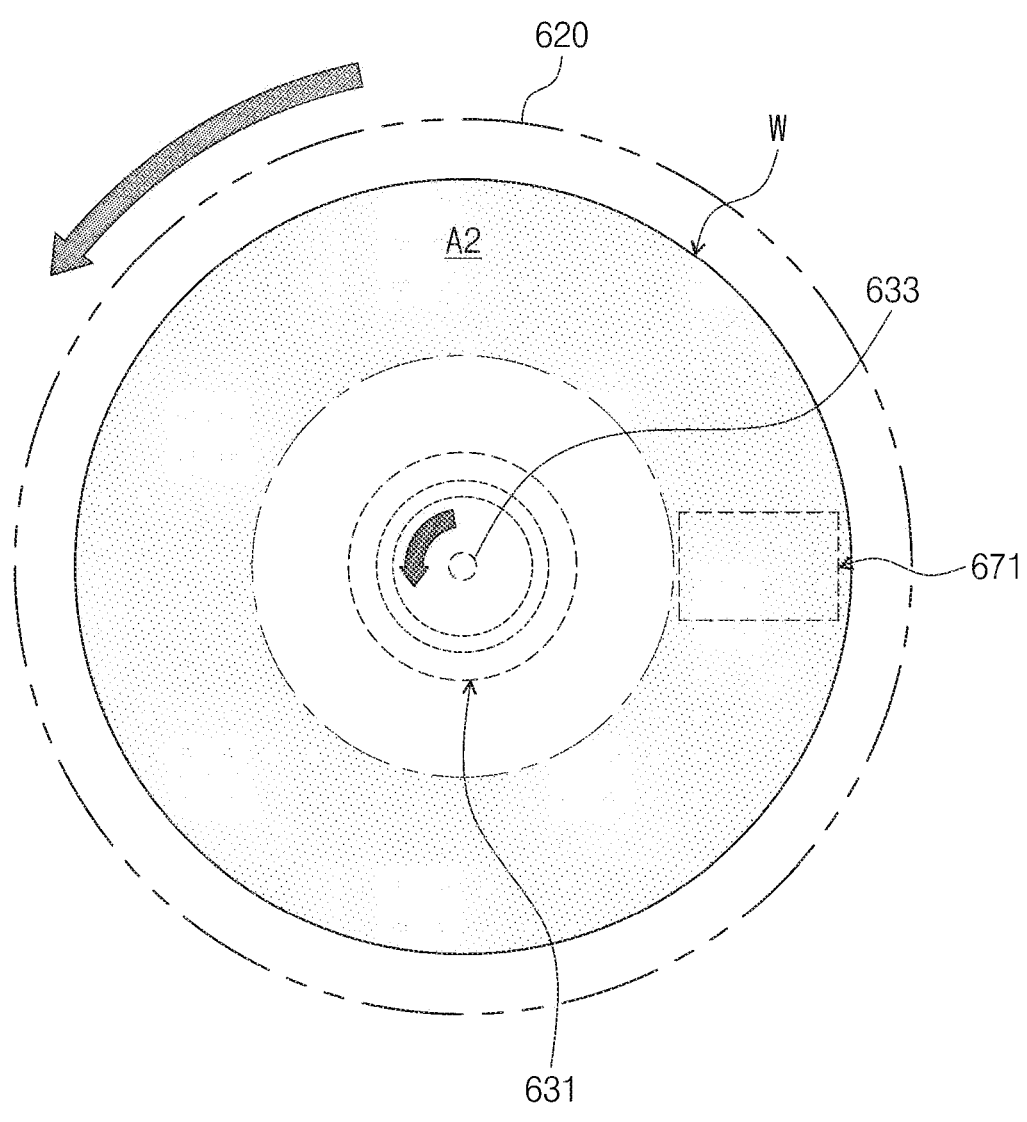
Figure 16:
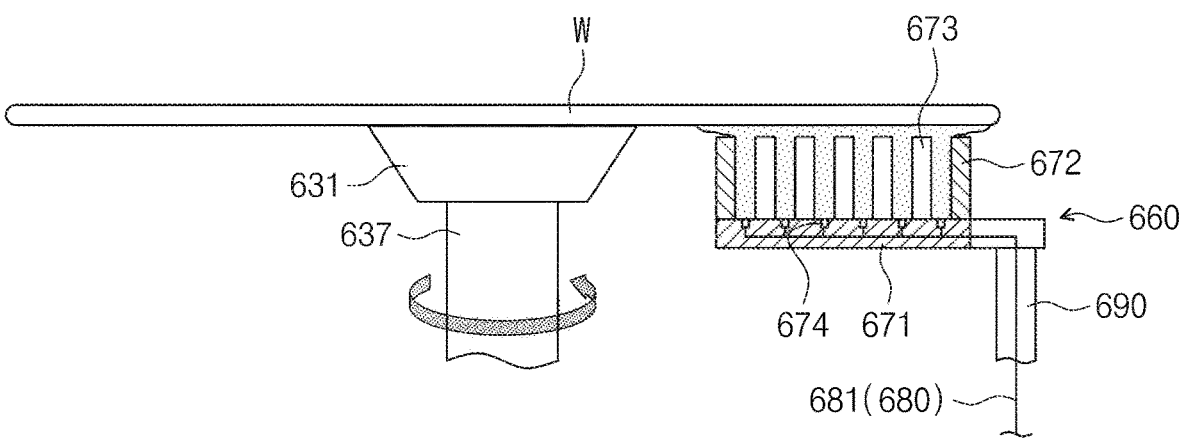
Figure 17:
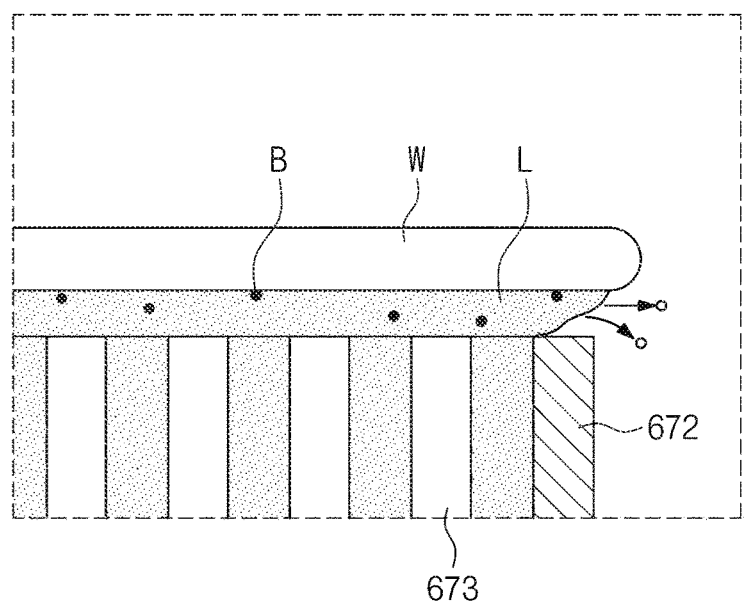

The shaft driver 639 rotates the chuck 631, and the substrate W supported by the chuck 631 also rotates. Although FIG. 15 illustrates that the substrate W supported by the chuck 631 rotates counterclockwise, the substrate W may rotate clockwise.

In addition, the cleaning liquid supply unit 680 supplies the cleaning liquid L in a direction toward the bottom surface of the substrate W through the hole 674. The foreign substances B attached to the bottom surface of the substrate W may be physically removed by the cleaning liquid L supplied to the bottom surface of the substrate W. In addition, the cleaning liquid L and the foreign substances B chemically react to remove the foreign substances B attached to the bottom surface of the substrate W.

As described above, the substrate W rotates while the bottom surface and the sidewall 672 of the substrate W, and the bottom surface of the substrate W and the protrusion 673 are spaced apart from each other. That is, the cleaning unit 660 according to an embodiment cleans the bottom surface of the substrate W in a non-contact manner. Accordingly, a shear force is generated between the bottom surface of the substrate W and the sidewall 672 by a centrifugal force generated by a rotation. In addition, the shear force is generated between the bottom surface of the substrate W and the protrusion 673. The foreign substances B attached to the bottom surface of the substrate W may be removed from the substrate W by the shear force generated on the bottom surface of the substrate W.

Accordingly, according to the above-described embodiment, the shear force is generated on the bottom side of the substrate W in a non-contact manner to minimize a damage to the substrate W, and the foreign substances B attached to the bottom surface of the substrate W may be easily removed.

If the second region cleaning step S10 is completed, the second support unit 640 supports the substrate W. More specifically, the plate 644 moves in the second direction 4, and the rotating pin 646 grabs a side end of the substrate W. Subsequently, the chuck 631 moves in a downward direction to be spaced apart from the bottom surface of the substrate W. Accordingly, the second region A2 (for example, the edge region) of the substrate W is supported by the second support unit 640, and the first region A1 (for example, the center region) of the substrate W is exposed.

The second support unit 640 moves in the first direction 2 while supporting the second region of the substrate W. More specifically, the plate 644 moves in the first direction 2. In addition, the treating container 620 into which the plate 644 is inserted moves together in the first direction 2. The plate 644 moves to the first region cleaning position. The first region cleaning position may be a position at which the first region of the substrate W and the body 671 overlap when viewed from above. In addition, in the first region cleaning position, the bottom surface of the substrate W may be spaced apart from a top end of the sidewall 672 and a top end of the protrusion 673, respectively, by a certain distance. More specifically, the first region cleaning position may be a position at which the bottom surface of the substrate W supported by the chuck 631 is 2 mm to 3 mm above the top surface of the sidewall 672. In addition, the first region cleaning position may be a position at which the bottom surface of the substrate W supported by the chuck 631 is 2 mm to 3 mm above the top surface of the protrusion 673.

If the plate 644 is completely moved to the first region cleaning position, the first region cleaning step S20 is performed.

In the first region cleaning position, the rotating pin 646 rotates the substrate W while a side end of the substrate W is gripped. Unlike FIG. 19, the rotating pin 646 may rotate the substrate W in the clockwise direction. In addition, the cleaning liquid supply unit 680 supplies the cleaning liquid to the bottom surface of the substrate W through the hole 674. The foreign substances attached to the bottom surface of the substrate W may be physically and/or chemically removed by the cleaning liquid.

In addition, as described above, the shear force is generated on the bottom side of the substrate W. The foreign substances attached to the bottom surface of the substrate W may be removed from the substrate W by the shear force generated at the bottom side of the substrate W. That is, the foreign substances attached to the bottom surface of the substrate W in a non-contact manner may be removed from the substrate W. Accordingly, a damage to the substrate W which may occur during the cleaning process may be minimized.

If the first region cleaning step S20 is completed, the chuck 631 upwardly moves the substrate W. The chuck 631 moves to a position higher than the top end of the treating container 620. An outer transfer means (e.g., the first robot 552) receives the substrate W from the chuck 631 and transfers the substrate W to the outside of the bottom surface cleaning chamber 600.

Although the above-described example illustrates that the second region cleaning step S10 and the first region cleaning step S20 are performed in a time series, the inventive concept is not limited thereto. For example, after the second region cleaning step S10 is performed first, the second region cleaning step S10 may be performed. In addition, the second region cleaning step S10 and the second region cleaning step S10 may be repeated in one cycle.

Hereinafter, a cleaning unit according to another embodiment of the inventive concept will be described. The cleaning unit described below is mostly the same as or similar to the configuration of the cleaning unit described above, except for the case to be additionally described. Accordingly, a description of the overlapping configuration will be omitted.

FIGS. 21 to 25 are cross-sectional views schematically showing a cleaning unit according to another embodiment.

Figure 21:
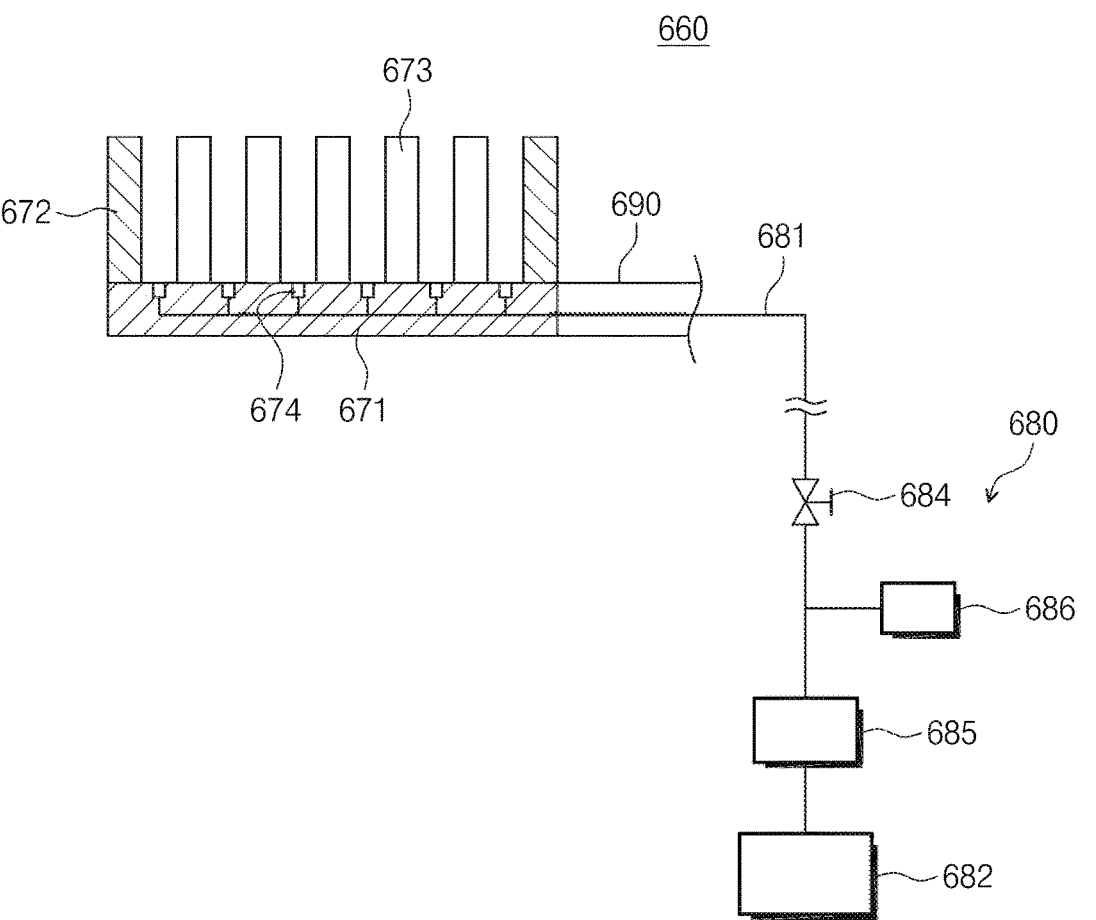
FIGS. 21 to 25 are cross-sectional views schematically showing a cleaning unit according to another embodiment.

Referring to FIG. 21, the cleaning liquid supply unit 680 according to an embodiment supplies the cleaning liquid to the bottom surface of the substrate W. The cleaning liquid may be a functional water. According to an embodiment, the functional water may be a liquid including radicals. The cleaning liquid supply unit 680 according to an embodiment may include a supply line 681, a source 682, a depressurizing pump (not shown), a valve 684, a decomposing 685, and a gas source 686.

The source 682 stores the cleaning liquid. The cleaning liquid according to an embodiment may be an $H_2O$. The decomposing unit 685 is connected to the supply line 681.

In addition, the decomposing unit 685 is positioned downstream of the supply line 681 than the source 682. The decomposing unit 685 may break a bonding relationship between materials constituting the cleaning liquid. For example, the decomposing unit 685 may break the bonding relationship of the $H_2O$ to generate an H radical and an OH radical. According to an embodiment, the decomposing unit 685 may be an electrolysis apparatus which breaks the bonding relationship between materials using electricity. In addition, the decomposing unit 685 may be an apparatus which breaks the bonding relationship between materials using a dissolved gas. In addition, the decomposing unit 685 may be an apparatus which breaks the bonding relationship between materials by applying microwaves. In addition, the decomposing unit 685 may be a remote plasma apparatus which breaks the bonding relationship between materials using a plasma.

The gas source 686 stores and supplies the gas. The gas source 686 is connected to the supply line 681. The gas source 686 is positioned downstream of the supply line 681 than the decomposing unit 685. The gas source 686 may supply an $H_2$ gas to the supply line 681. In the supply line 681, the $H_2$ gas reacts with an OH radical to remove the OH radical. Accordingly, the H radical may be supplied to the bottom surface of the substrate through the supply line 681 and the hole 674. The H radical supplied to the bottom surface of the substrate W may break the bonding of foreign substances attached to the bottom surface of the substrate W. In particular, since the H radical may break the bonding of foreign substances which are fine particles, it is possible to easily remove foreign substances which are not removed by a physical, a chemical and/or the shear force among foreign substances attached to the bottom surface of the substrate W.

Figure 22:
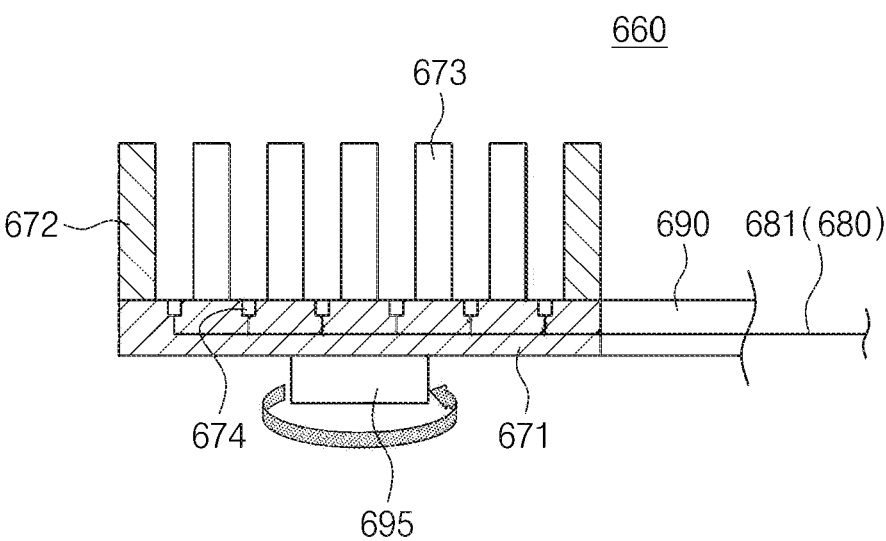

Referring to FIG. 22, the cleaning unit 660 according to an embodiment may further include a rotation driver 695. The rotation driver 695 is coupled to the body 671. For example, the rotation driver 695 is coupled to the bottom end of the body 671. More specifically, the rotation driver 695 may be coupled to the body 671 through an axis (not shown) which penetrates the inside of the body 671 and has a vertical lengthwise direction. The rotation driver 695 may rotate the body 671 with an axis penetrating the inside of the body 671 as a reference axis.

According to an embodiment, in the above-described second region cleaning step S10, the chuck 631 may rotate the substrate W, and the rotation driver 695 may rotate the body 671. In addition, in the first region cleaning step S20, the rotating pin 646 may rotate the substrate W, and the rotation driver 695 may rotate the body 671.

In the second region cleaning step S10 and the first region cleaning step S20, a rotation speed of the substrate W and a rotation speed of the body 671 may be different from each other. In addition, in the second region cleaning step S10 and the first region cleaning step S20, a rotation direction of the substrate W and a rotation direction of the body 671 may be the same. By simultaneously rotating the substrate W and the body 671 in the second region cleaning step S10 and the first region cleaning step S20, the shear force generated on the bottom side of the substrate W can be further strengthened. Accordingly, foreign substances attached to the bottom surface of the substrate W may be more easily removed from the substrate W. However, unlike the above-described example, the rotation direction of the body 671 and the rotation direction of the substrate W may be different from each other.

Figure 23:
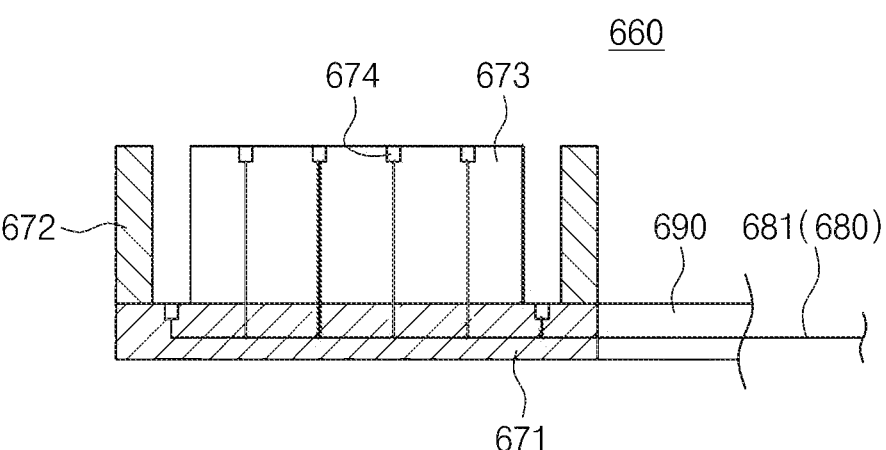

Referring to FIG. 23, the protrusion 673 according to an embodiment may have a substantially rectangular parallel-epiped shape. A top end of the protrusion 673 may be positioned at a height similar to a top end of the sidewall 672. More preferably, the top end of the protrusion 673 may be positioned at a height slightly lower than the top end of the sidewall 672. In addition, an outer surface of the protrusion 673 is disposed to be spaced apart from an inner surface of the sidewall 672. The holes 674 are formed in a space between the protrusion 673 and the sidewall 672 and the top portion of the protrusion 673.

Figure 24:
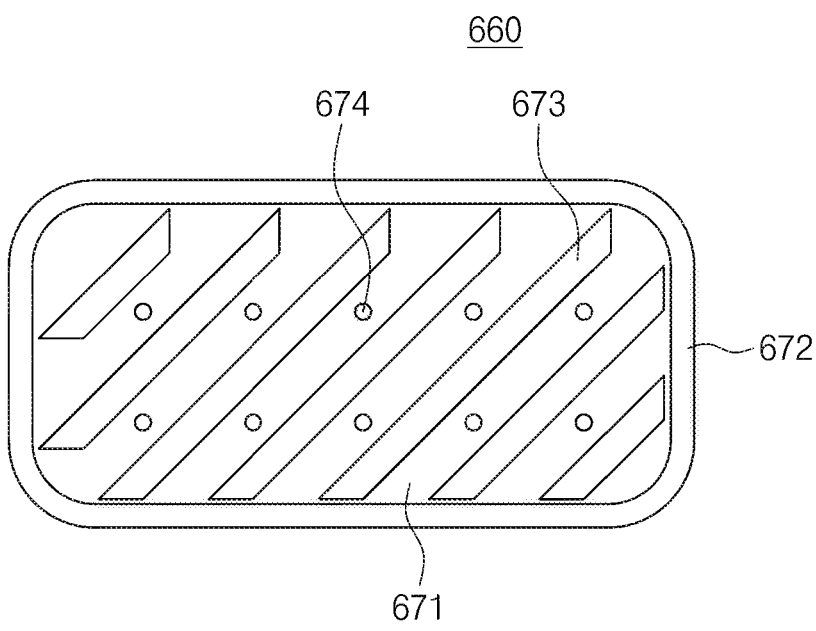

Referring to FIG. 24, the protrusion 673 according to an embodiment may have a pad shape. For example, the protrusion 673 may be a brush having a plurality of pad shapes. The protrusion 673 may have a structure in which the plurality of pad shapes are disposed to be spaced apart from each other by a predetermined interval in an oblique direction with respect to a lengthwise direction of the body 671. However, unlike the above-described example, an arrangement form of the plurality of pad shapes may be variously modified.

Figure 25:
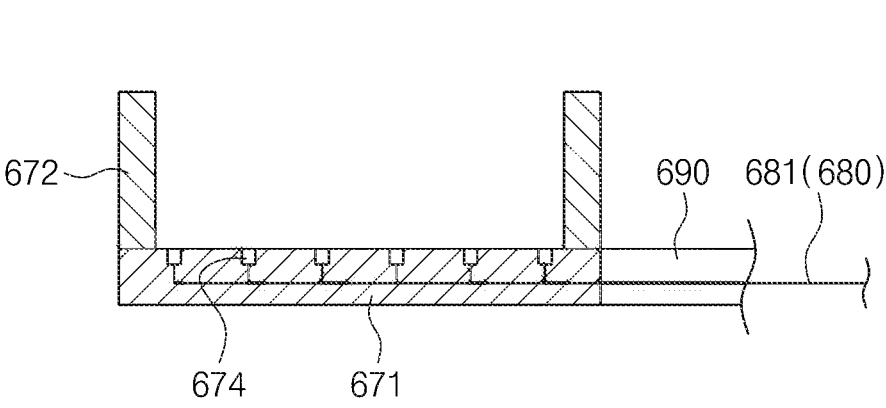

Referring to FIG. 25, the protrusion 673 may not be formed in the body 671 according to an embodiment. Accordingly, in the second region cleaning step S10 and the first region cleaning step S20, foreign substances attached to the bottom surface of the substrate W may be removed by the shear force generated between the bottom surface of the substrate W and the sidewall 672.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
a support configured to support a substrate; and
a cleaner configured to clean a flat bottom surface of the substrate when the substrate is on the support with the flat bottom surface in a horizontal plane, and
wherein the cleaner comprises,
a body; and
a protrusion formed to be upwardly and vertically protruding from the body toward the flat bottom surface when the substrate is on the support, the protrusion defining at least one hole in communication with a cleaning liquid supply, the at least one hole being configured to direct a cleaning liquid from the cleaning liquid supply to the flat bottom surface, and
the protrusion being positioned to be spaced apart from the flat bottom surface, when the substrate is on the support.

2. The substrate treating apparatus of claim 1, wherein the hole and the protrusion are positioned to not overlap each other when seen from above, when the substrate is supported on the support.

3. The substrate treating apparatus of claim 2, wherein the protrusion has a pad shape.

4. The substrate treating apparatus of claim 2, wherein the protrusion has a protrusion shape.

5. The substrate treating apparatus of claim 1, wherein the cleaner further comprises a sidewall formed along a circumferential direction of the body, and the protrusion is positioned within a region surrounded by the sidewall, and a top surface of the sidewall being spaced apart from the flat bottom surface.

6. The substrate treating apparatus of claim 1, further comprising:

a housing at which the support and the cleaner is positioned therein, and wherein the support includes, a first support configured to expose an edge region of the substrate, the first support being configured to support and rotate a central region of the substrate; and a second support configured to expose the central region of the substrate, the second support being configured to support and rotate the edge region, and the second support being movable along a guide rail installed at a sidewall of the housing.

7. The substrate treating apparatus of claim 6, wherein the second support comprises:

a bracket positioned on the guide rail;

a plate coupled to the bracket; and a rotation pin installed on the plate, supporting a side end of the substrate, and rotating the substrate with a lengthwise direction of an up/down direction as an axis.

8. The substrate treating apparatus of claim 7, wherein the first support is configured to rotate the substrate at a position which overlaps the edge region and the protrusion, and the second support is configured to rotate the substrate at a position overlapping the central region and the protrusion.

9. The substrate treating apparatus of claim 6, wherein the cleaner further comprises a rotation driver configured to rotate the body with respect to an axis in an up/down direction and penetrate the body, and the first support or the second support being configured to rotate the substrate, and the rotation driver being configured to rotate the body, at a position at which the protrusion and the flat bottom surface of the substrate overlap.

10. The substrate treating apparatus of claim 9, wherein the cleaner includes any one of a deionized water, an ozone water, a hydrogen water, or an ammonia water.

11. The substrate treating apparatus of claim 9, wherein the cleaning liquid includes a functional water, and the functional water includes a radical.

12. The substrate treating apparatus of claim 1, wherein a pattern is formed at a top surface of the substrate when the substrate is supported on the support.

13. The substrate treating apparatus of claim 1, wherein the cleaner is configured to supply the cleaning liquid between the body and the flat bottom surface, when the substrate is supported on the support.

14. A substrate treating apparatus comprising:

a housing;

a first support configured to support and rotate a central region of a substrate, the substrate including the central region and an edge central region;

a second support configured to support and rotate the edge central region of the substrate;

a treating container configured to surround the substrate on the first support or the substrate supported on the second support within the housing; and a cleaner configured to clean a bottom surface of the substrate, wherein the first support includes a chuck for supporting the central region, and the second support comprises, a bracket configured to move along a guide rail installed at a sidewall of the housing;

a plate coupled to the bracket; and a rotation pin on the plate, the rotation pin being configured to support a side end of the substrate, the rotation pin being configured to rotate the substrate with a lengthwise direction of an up/down direction as an axis, and wherein the cleaner comprises, a body;

a sidewall upwardly extending along a circumferential direction of the body;

an arm supporting the body;

a brush positioned at an inner side of an inner wall and upwardly protruding from the body; and a cleaning liquid supply connected to a hole defined by the body, the cleaning liquid supply being configured to supply a cleaning liquid to the bottom surface, when the substrate is supported on the support, and wherein a top end of the brush and a bottom end of the sidewall are each positioned to be spaced apart from the bottom surface.

15. The substrate treating apparatus of claim 14, wherein the cleaning liquid includes any one of a deionized water, an ozone water, a hydrogen water, or an ammonia water.

16. The substrate treating apparatus of claim 15, wherein the cleaning liquid includes a functional water, and the functional water includes a radical.

17. The substrate treating apparatus of claim 15, wherein a pattern is formed at a top surface of the substrate when the substrate is supported on the support.

* * * * *